US012641934B2

(12) United States Patent
Boutami et al.

(10) Patent No.: US 12,641,934 B2
(45) Date of Patent: May 26, 2026

(54) MICRO-LED DESIGN FOR HIGH LIGHT EXTRACTION EFFICIENCY

(71) Applicant: Meta Platforms Technologies, LLC, Menlo Park, CA (US)

(72) Inventors: Salim Boutami, Seattle, WA (US); Guillaume Lheureux, Cork (IE); Sophia Antonia Fox, Cork (IE); Yong Tae Moon, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 792 days.

(21) Appl. No.: 17/819,903

(22) Filed: Aug. 15, 2022

(65) Prior Publication Data
US 2024/0055569 A1     Feb. 15, 2024

(51) Int. Cl.
*H10H 20/856*     (2025.01)
(52) U.S. Cl.
CPC .................................. *H10H 20/856* (2025.01)
(58) Field of Classification Search
CPC .. H10H 20/856; H10H 20/855; H10H 20/819; H10H 20/841; H10H 29/142
See application file for complete search history.

(56) References Cited

U.S. PATENT DOCUMENTS

| | | | |
|---|---|---|---|
| 2017/0069611 A1* | 3/2017 | Zhang | H01L 25/0753 |
| 2017/0069612 A1 | 3/2017 | Zhang et al. | |
| 2020/0135977 A1 | 4/2020 | Leung et al. | |
| 2021/0111319 A1* | 4/2021 | Lutgen | H10H 20/84 |
| 2021/0157142 A1* | 5/2021 | Scheller | H10H 20/821 |
| 2022/0010942 A1* | 1/2022 | Cornelissen | F21V 5/007 |
| 2022/0065425 A1* | 3/2022 | Cornelissen | G02B 27/30 |
| 2022/0100070 A1* | 3/2022 | Rayer | G03B 21/2033 |

OTHER PUBLICATIONS

European Search Report for European Patent Application No. 23191405.2 dated Jan. 8, 2024, 05 pages.

* cited by examiner

*Primary Examiner* — Jonathan Han
(74) *Attorney, Agent, or Firm* — Greenberg Traurig, LLP

(57)     ABSTRACT

Disclosed herein are techniques for micro-light emitting diodes (micro-LEDs). According to certain embodiments, a micro-LED device includes a micro-LED comprising a semiconductor mesa structure configured to emit light, a spacer layer on the micro-LED, and a micro-lens on the spacer layer and configured to extract and collimate the light emitted by the micro-LED, where a thickness of the spacer layer is selected such that a focal point of the micro-lens is at a front surface of the semiconductor mesa structure.

20 Claims, 16 Drawing Sheets

MICRO-LED DESIGN FOR HIGH LIGHT EXTRACTION EFFICIENCY

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("μLEDs") based on III-nitride semiconductors, such as alloys of AlN, GaN, InN, AlGaInP, other ternary and quaternary nitride, phosphide, and arsenide compositions, and the like, have begun to be developed for various display applications due to their small size (e.g., with a linear dimension less than 100 μm, less than 50 μm, less than 10 μm, or less than 5 μm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro-light emitting diodes (micro-LEDs). More specifically, and without limitation, disclosed herein are micro-LEDs with specific structures and aspect ratios that have improved collected light extraction efficiencies (LEEs). Various inventive embodiments are described herein, including devices, systems, methods, structures, materials, processes, and the like.

According to some embodiments, a micro-LED device may include a micro-LED comprising a semiconductor mesa structure configured to emit light, a spacer layer on the micro-LED, and a micro-lens on the spacer layer and configured to extract and collimate the light emitted by the micro-LED, where a thickness of the spacer layer is selected such that a focal point of the micro-lens is at a front surface of the semiconductor mesa structure.

According to certain embodiments, a device may include a micro light emitting diode (micro-LED) comprising a semiconductor mesa structure configured to emit light, the semiconductor mesa structure characterized by sidewalls that are inwardly tilted in a light emitting direction, where a thickness of semiconductor materials in the semiconductor mesa structure may be close to about a wavelength of the light emitted by the micro-LED; a spacer layer on the micro-LED, and a micro-lens on the spacer layer and configured to extract and collimate the light emitted by the micro-LED, where a thickness of the spacer layer is equal to or greater than about 2 times of the thickness of the semiconductor materials in the semiconductor mesa structure such that a focal point of the micro-lens is at or near a front surface of the semiconductor mesa structure.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
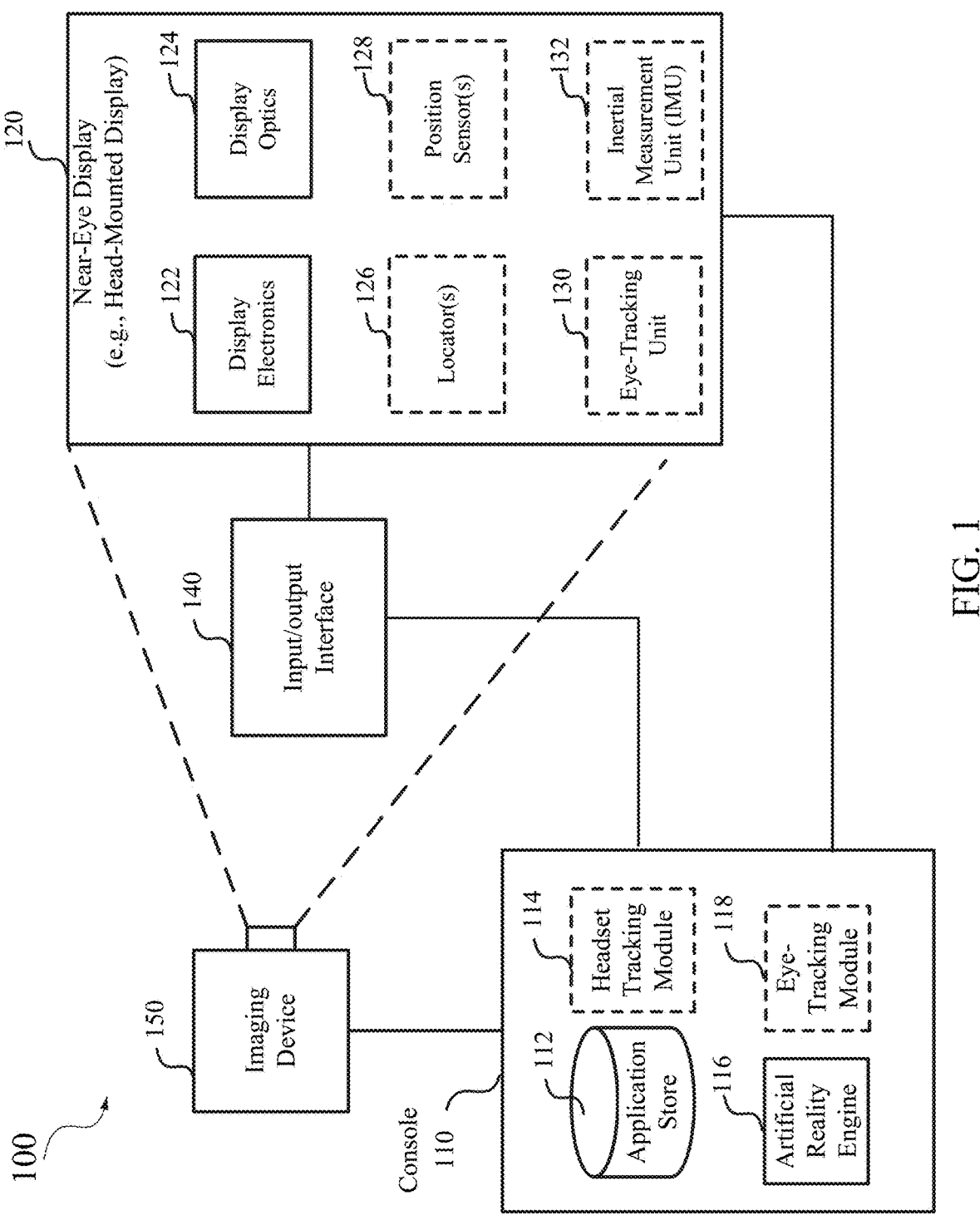
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to micro-light emitting diodes (micro-LEDs). More specifically, and without limitation, disclosed herein are techniques for improving the beam profiles of light beams extracted from a micro-LED array and the light extraction efficiency for emitted light within a small emission cone (e.g., ±18.5°), thereby more efficiently coupling the extracted light through a display system onto user's eyes.

In some micro-LED-based display systems, light emitted from a micro-LED array may be collimated and coupled into a display (e.g., a waveguide display) for delivering images to an output pupil (or eyebox). The overall efficiency Tot of a waveguide-based display system may be determined by $\eta_{tot} = \eta_{EQE} \times \eta_{in} \times \eta_{out}$, where $\eta_{EQE}$ is the external quantum efficiency (EQE) of each micro-LED and may be proportional to the carrier (e.g., electron) injection efficiency, the internal quantum efficiency, and the light extraction efficiency (LEE), $\eta_{in}$ is the in-coupling efficiency of display light from the micro-LEDs into the waveguide, and $\eta_{out}$ is the out-coupling efficiency of the display light from the waveguide towards the user's eye. In LEDs for near-eye display, only light that is emitted from an LED into a certain direction and/or within a certain emission angle range (e.g., within about ±18.5°) may be collected by the display optics of the near-eye displays. The proportion of the emitted photons that are extracted from the LED and are collected by the display optics may be referred to herein as the collected LEE. For LEDs with reduced physical dimensions, such as micro-LEDs, the IQEs, collected LEEs, and EQEs may be very low. Improving the efficiencies of the micro-LEDs can be challenging.

According to certain embodiments, to improve the LEE, in particular, the collected LEE, micro-LED devices with certain structures and aspect ratios are presented. The micro-LED device may include a micro-LED that includes a semiconductor mesa structure that includes semiconductor layers (e.g., an n-GaN layer, InGaN/GaN quantum well layers, and a layer of p-GaN), where the sidewalls of the semiconductor mesa structure may be straight, outwardly tilted, or inwardly tilted in a light emitting direction. The micro-LED device may also include a spacer layer (e.g., including a dielectric material such as SiN or SiO₂) on the micro-LED, and a micro-lens disposed on the spacer layer and configured to extract and collimate light emitted by the micro-LED. The lateral size (e.g., width) of the mesa-structure may be much smaller than the lateral size of the micro-lens. For example, the lateral size of the micro-lens may be equal to or greater than about 1.5, 2, 3, or more times of the lateral size of the semiconductor mesa structure, and thus the light emitting aperture of the micro-LED may be close to a point source with respect to the micro-lens. To further improve the collected LEE (e.g., LEE of light with emission angles within about ±18.5°) of the micro-LED, the thickness of the spacer layer and the total thickness of the semiconductor mesa structure (e.g., the thickness of the semiconductor materials in the semiconductor mesa structure) may be selected such that a focal point of the micro-lens may be at or close to a light emitting surface of the semiconductor mesa structure. For example, the spacer layer (e.g., SiN) may have a thickness about 2, 3, or more times of the total thickness of the semiconductor mesa structure. In some embodiments, the total thickness of the semiconductor mesa structure may be about the wavelength of light emitted by the micro-LED. As a result, the micro-lens may more efficiently collimate the light emitted from the micro-LED, and the collected LEE (e.g., LEE of light with emission angles within about ±18.5°) of the micro-LED device may increase to about 10%, much higher compared with some micro-LED devices with different structures and aspect ratios (e.g., having a collected LEE of about 2.0%). With the improved structure (e.g., aspect ratio), the collected/total LEE ratio of the micro-LED device disclosed herein may also increase to about 40% compared with some existing micro-LED devices having a collected/total LEE ratio of about 10%, which indicates that the extracted light beam is better collimated.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
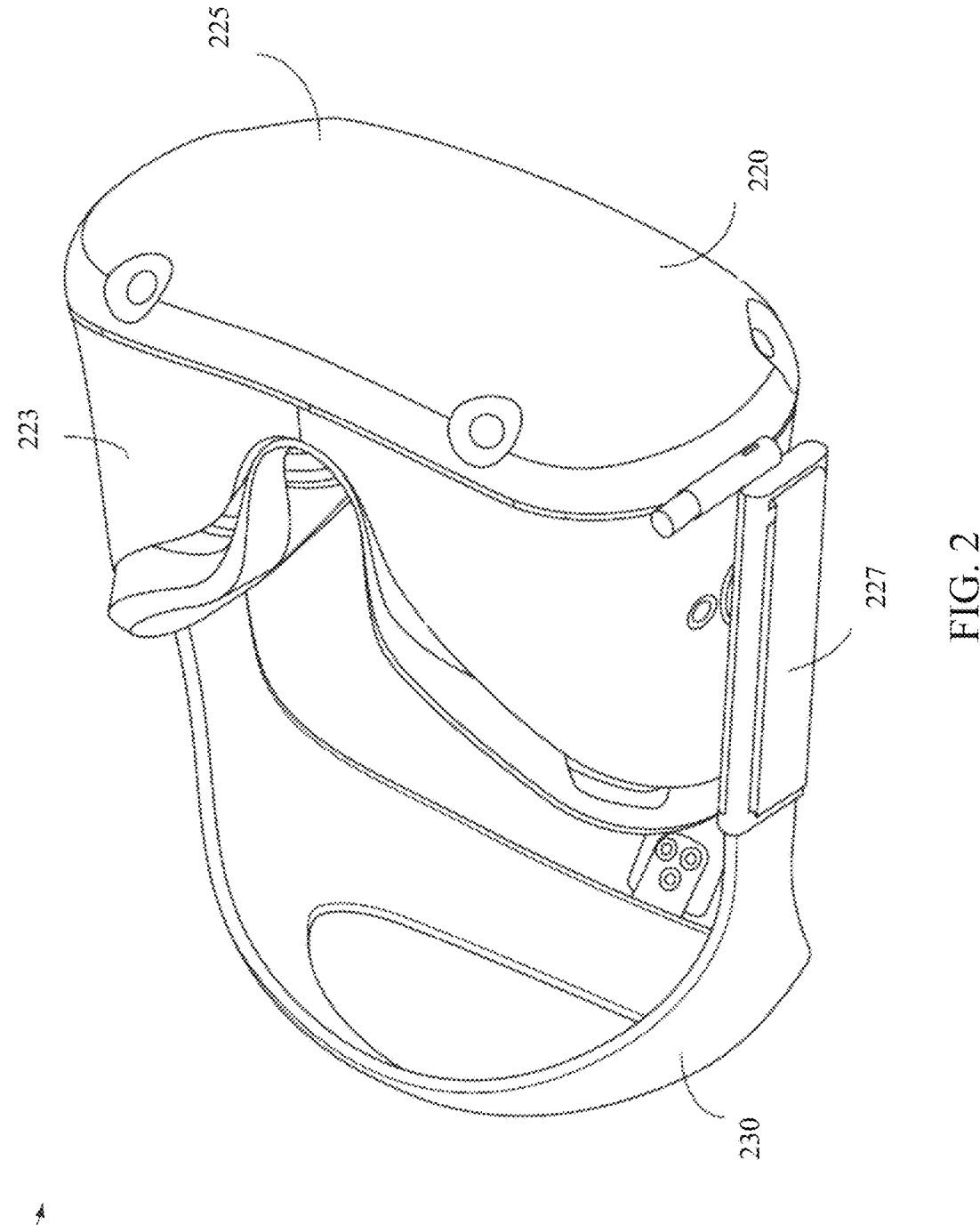
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMO-LED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
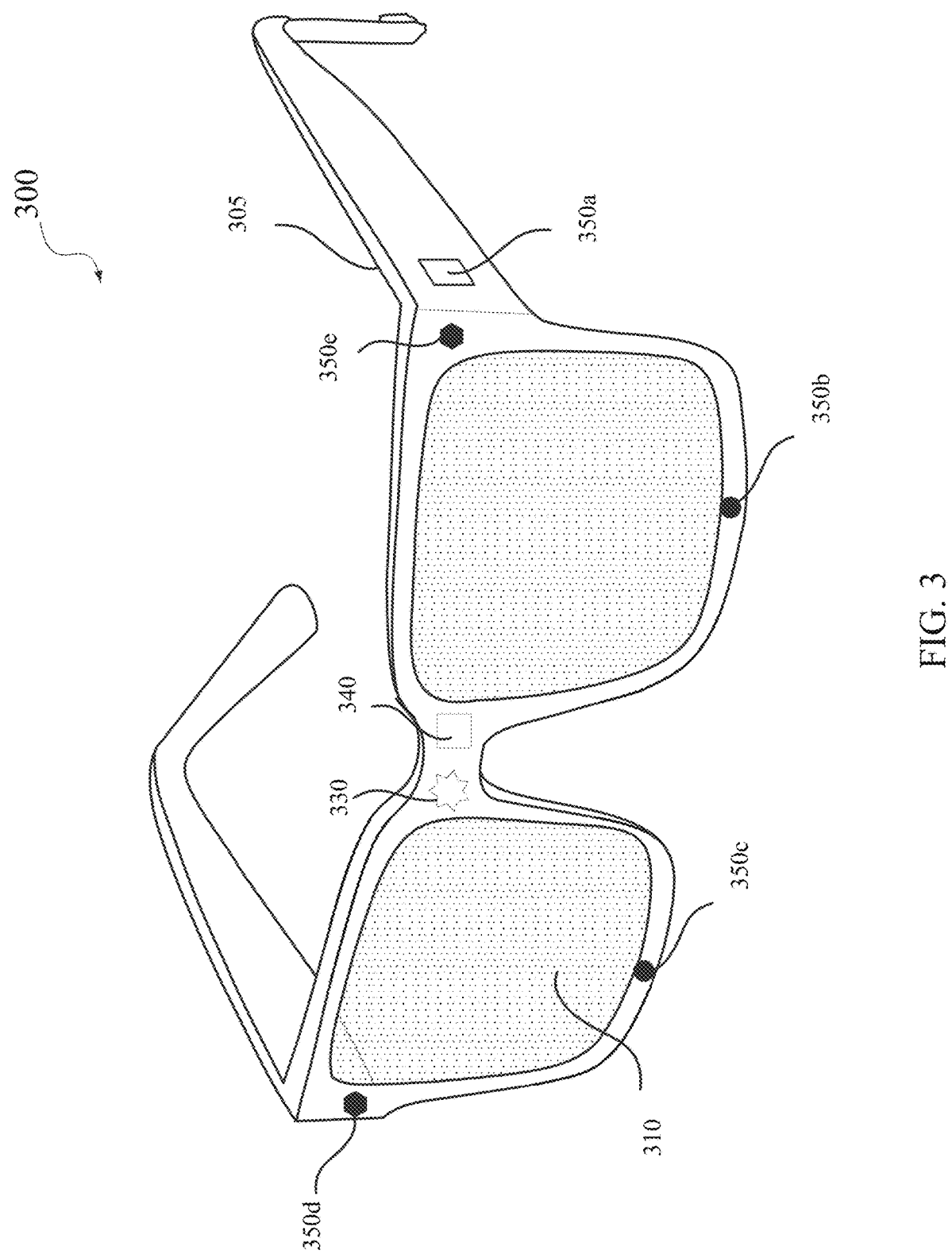
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305.

In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
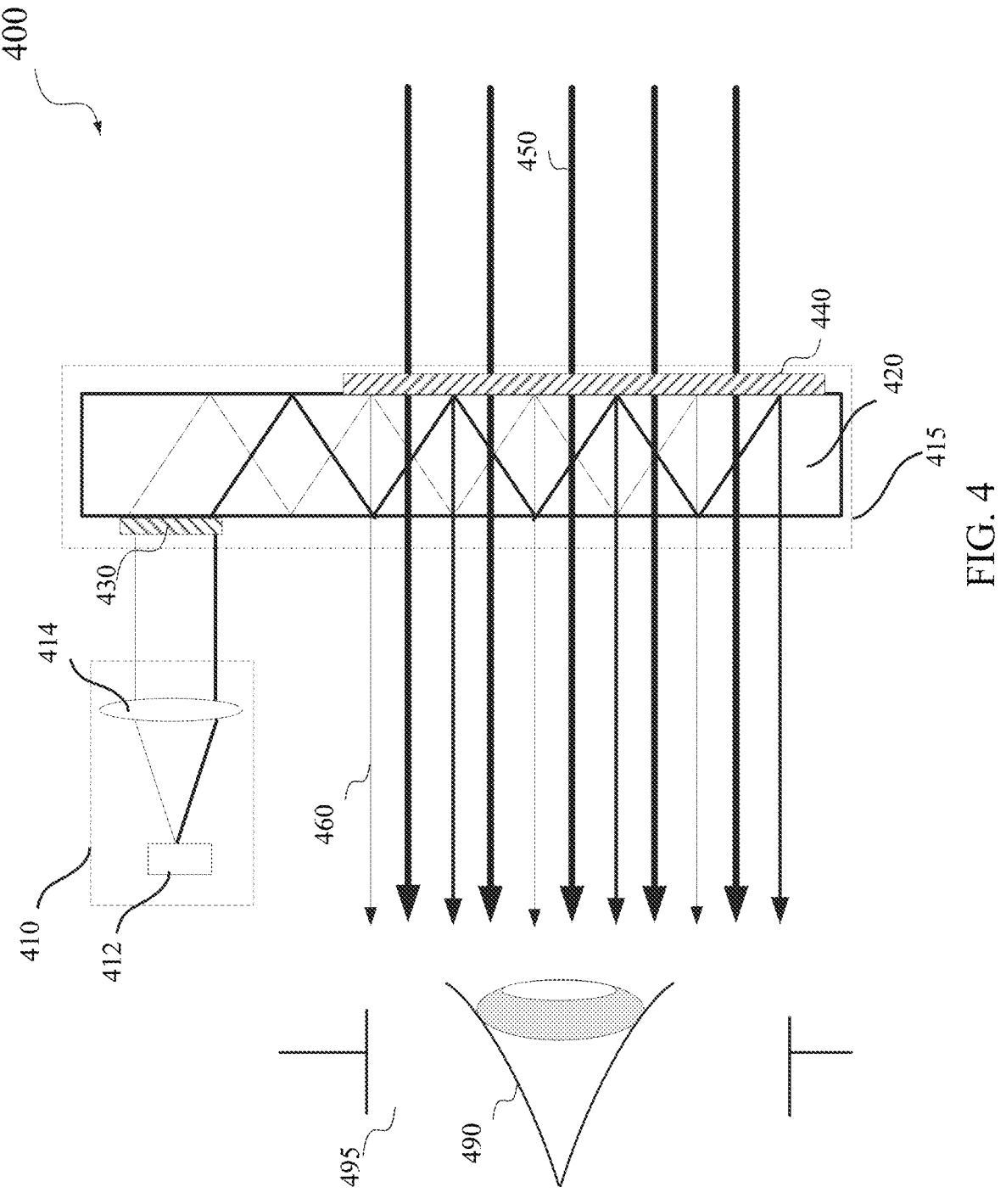
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figures 5A, 5B:
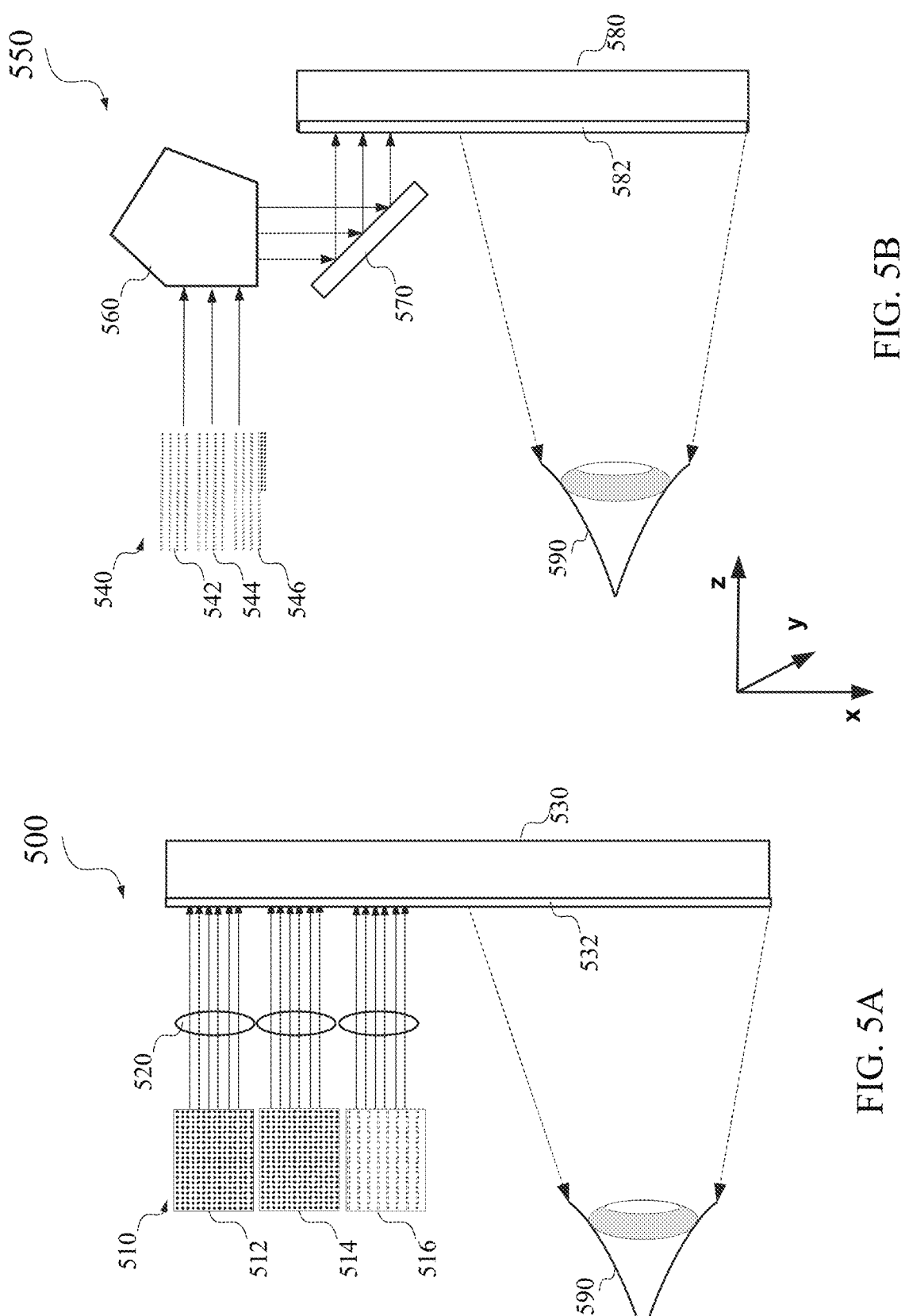
FIG. 5A illustrates an example of a near-eye display device including a waveguide display according to certain embodiments.
FIG. 5B illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror

570 rotates in each scanning cycle. As such, different images may be projected to user's eye 590 in different scanning cycles.

Figure 6:
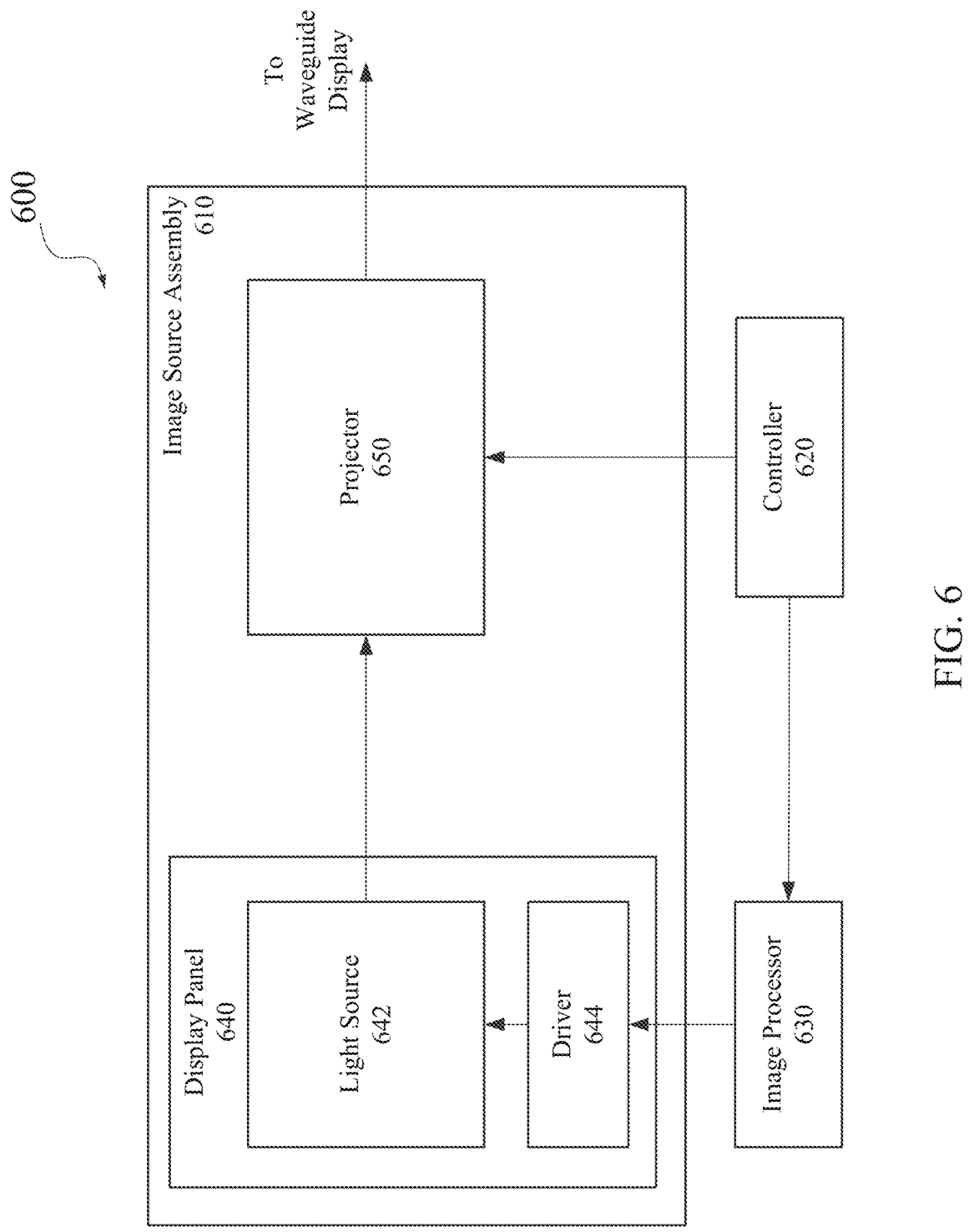
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1.

The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
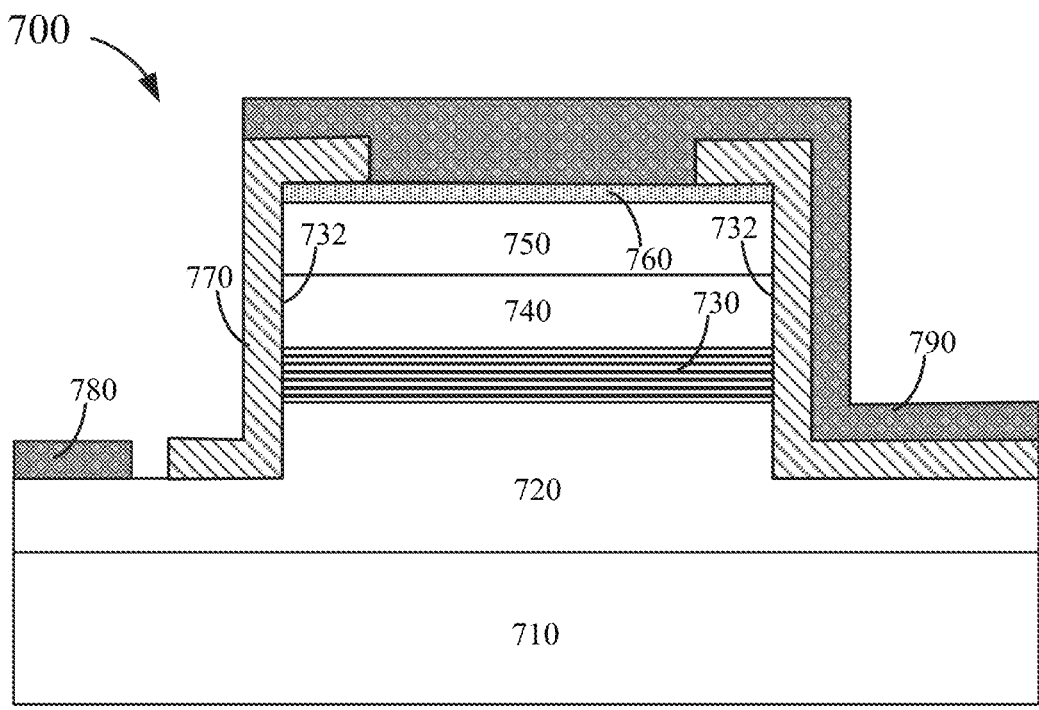
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
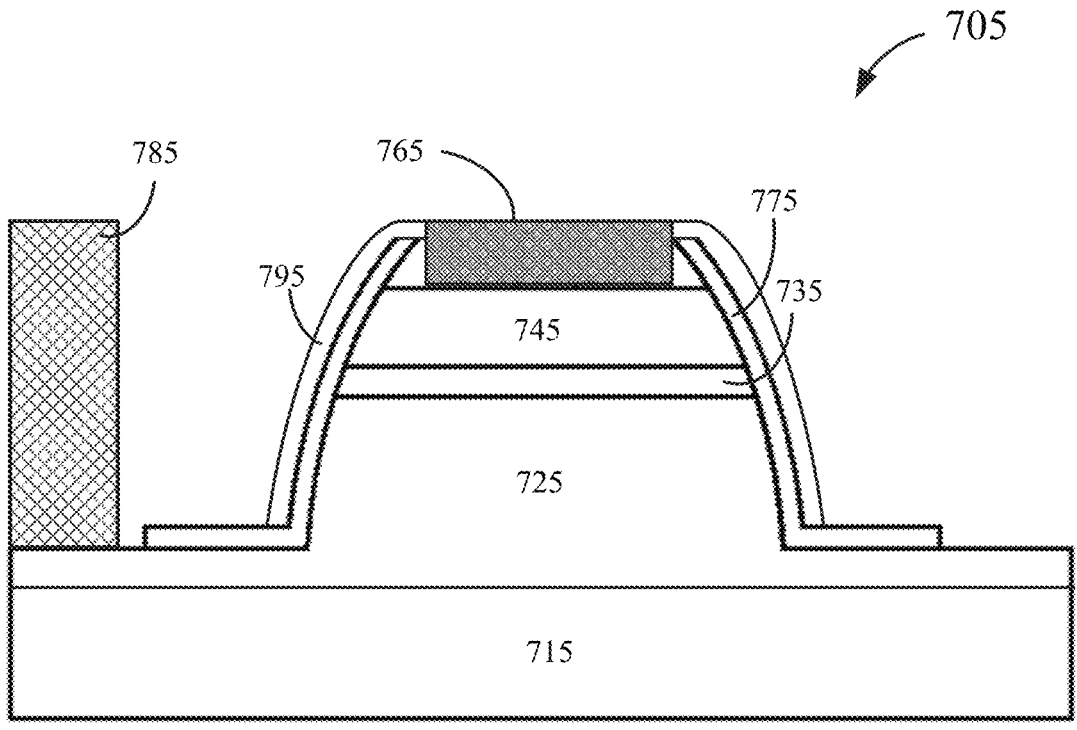
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

Figures 8A, 8B:
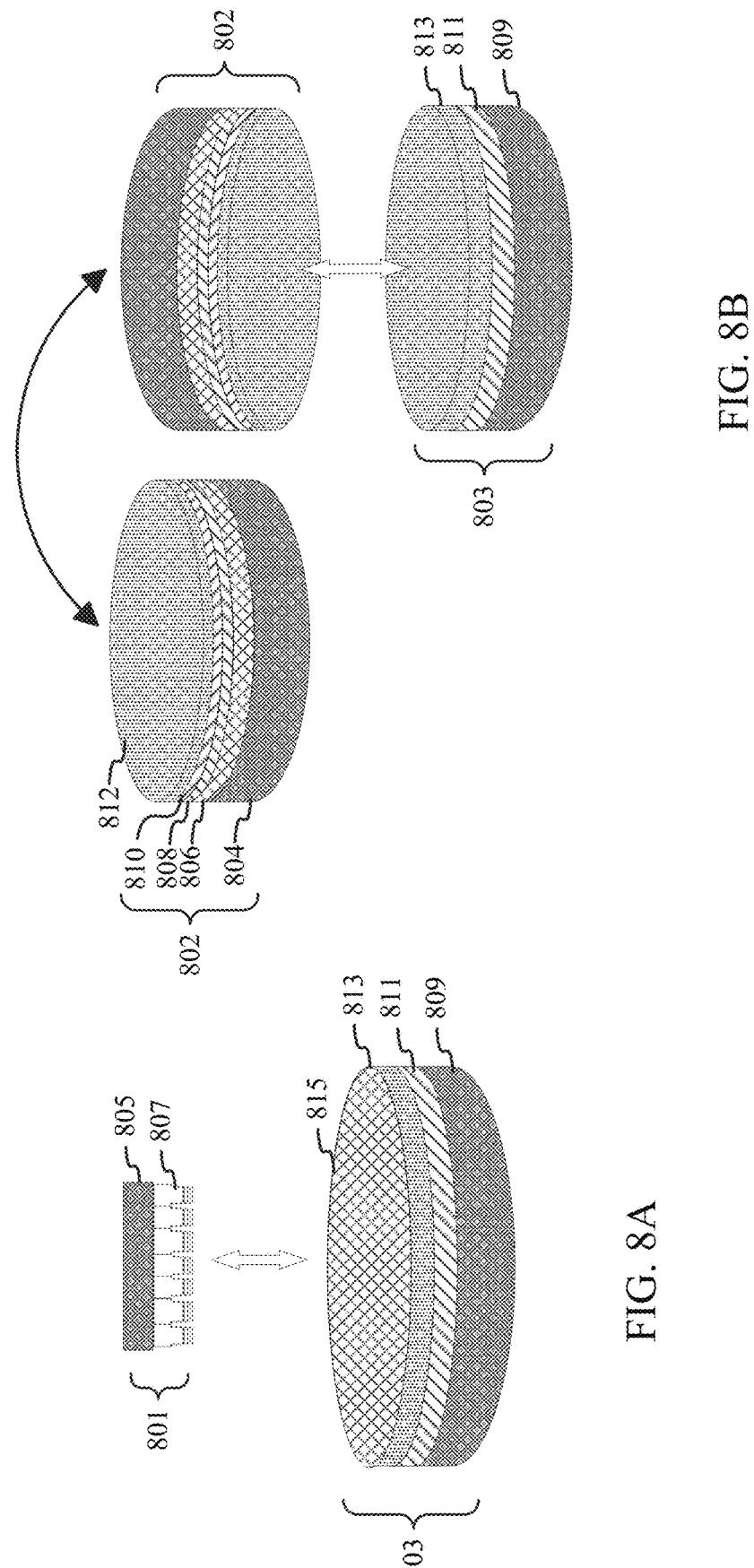
FIG. 8A illustrates an example of a method of die-to-wafer bonding for arrays of LEDs according to certain embodiments.
FIG. 8B illustrates an example of a method of wafer-to-wafer bonding for arrays of LEDs according to certain embodiments.

FIG. 8A illustrates an example of a method of die-to-wafer bonding for arrays of LEDs according to certain embodiments. In the example shown in FIG. 8A, an LED array 801 may include a plurality of LEDs 807 on a carrier substrate 805. Carrier substrate 805 may include various materials, such as GaAs, InP, GaN, AlN, sapphire, SiC, Si, or the like. LEDs 807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 803 may include a base layer 809 having passive or active integrated circuits (e.g., driver circuits 811) fabricated thereon. Base layer 809 may include, for example, a silicon wafer. Driver circuits 811 may be used to control the operations of LEDs 807. For example, the driver circuit for each LED 807 may include a 2T1C pixel structure that has two transistors and one capacitor. Wafer 803 may also include a bonding layer 813. Bonding layer 813 may include various materials, such as a metal, an oxide, a dielectric, CuSn, AuTi, and the like. In some embodiments, a patterned layer 815 may be formed on a surface of bonding layer 813, where patterned layer 815 may include a metallic grid made of a conductive material, such as Cu, Ag, Au, Al, or the like.

LED array 801 may be bonded to wafer 803 via bonding layer 813 or patterned layer 815. For example, patterned layer 815 may include metal pads or bumps made of various materials, such as CuSn, AuSn, or nanoporous Au, that may be used to align LEDs 807 of LED array 801 with corresponding driver circuits 811 on wafer 803. In one example, LED array 801 may be brought toward wafer 803 until LEDs 807 come into contact with respective metal pads or bumps corresponding to driver circuits 811. Some or all of LEDs 807 may be aligned with driver circuits 811, and may then be bonded to wafer 803 via patterned layer 815 by various bonding techniques, such as metal-to-metal bonding. After LEDs 807 have been bonded to wafer 803, carrier substrate 805 may be removed from LEDs 807.

FIG. 8B illustrates an example of a method of wafer-to-wafer bonding for arrays of LEDs according to certain embodiments. As shown in FIG. 8B, a first wafer 802 may include a substrate 804, a first semiconductor layer 806, active layers 808, and a second semiconductor layer 810. Substrate 804 may include various materials, such as GaAs, InP, GaN, AlN, sapphire, SiC, Si, or the like. First semiconductor layer 806, active layers 808, and second semiconductor layer 810 may include various semiconductor materials, such as GaN, InGaN, (AlGaIn)P, (AlGaIn)AsP, (AlGaIn)AsN, (Eu:InGa)N, (AlGaIn)N, or the like. In some embodiments, first semiconductor layer 806 may be an n-type layer, and second semiconductor layer 810 may be a p-type layer. For example, first semiconductor layer 806 may be an n-doped GaN layer (e.g., doped with Si or Ge), and second semiconductor layer 810 may be a p-doped GaN layer (e.g., doped with Mg, Ca, Zn, or Be). Active layers 808 may include, for example, one or more GaN layers, one or more InGaN layers, one or more AlInGaP layers, and the like, which may form one or more heterostructures, such as one or more quantum wells or MQWs.

In some embodiments, first wafer 802 may also include a bonding layer. Bonding layer 812 may include various materials, such as a metal, an oxide, a dielectric, CuSn, AuTi, or the like. In one example, bonding layer 812 may include p-contacts and/or n-contacts (not shown). In some embodiments, other layers may also be included on first wafer 802, such as a buffer layer between substrate 804 and first semiconductor layer 806. The buffer layer may include various materials, such as polycrystalline GaN or AlN. In some embodiments, a contact layer may be between second semiconductor layer 810 and bonding layer 812. The contact layer may include any suitable material for providing an electrical contact to second semiconductor layer 810 and/or first semiconductor layer 806.

First wafer 802 may be bonded to wafer 803 that includes driver circuits 811 and bonding layer 813 as described above, via bonding layer 813 and/or bonding layer 812. Bonding layer 812 and bonding layer 813 may be made of the same material or different materials. Bonding layer 813 and bonding layer 812 may be substantially flat. First wafer 802 may be bonded to wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, first wafer 802 may be bonded to wafer 803 with the p-side (e.g., second semiconductor layer 810) of first wafer 802 facing down (i.e., toward wafer 803). After bonding, substrate 804 may be removed from first wafer 802, and first wafer 802 may then be processed from the n-side. The processing may include, for example, the formation of certain mesa shapes for individual LEDs, as well as the formation of optical components corresponding to the individual LEDs.

Figures 9A, 9B, 9C, 9D:
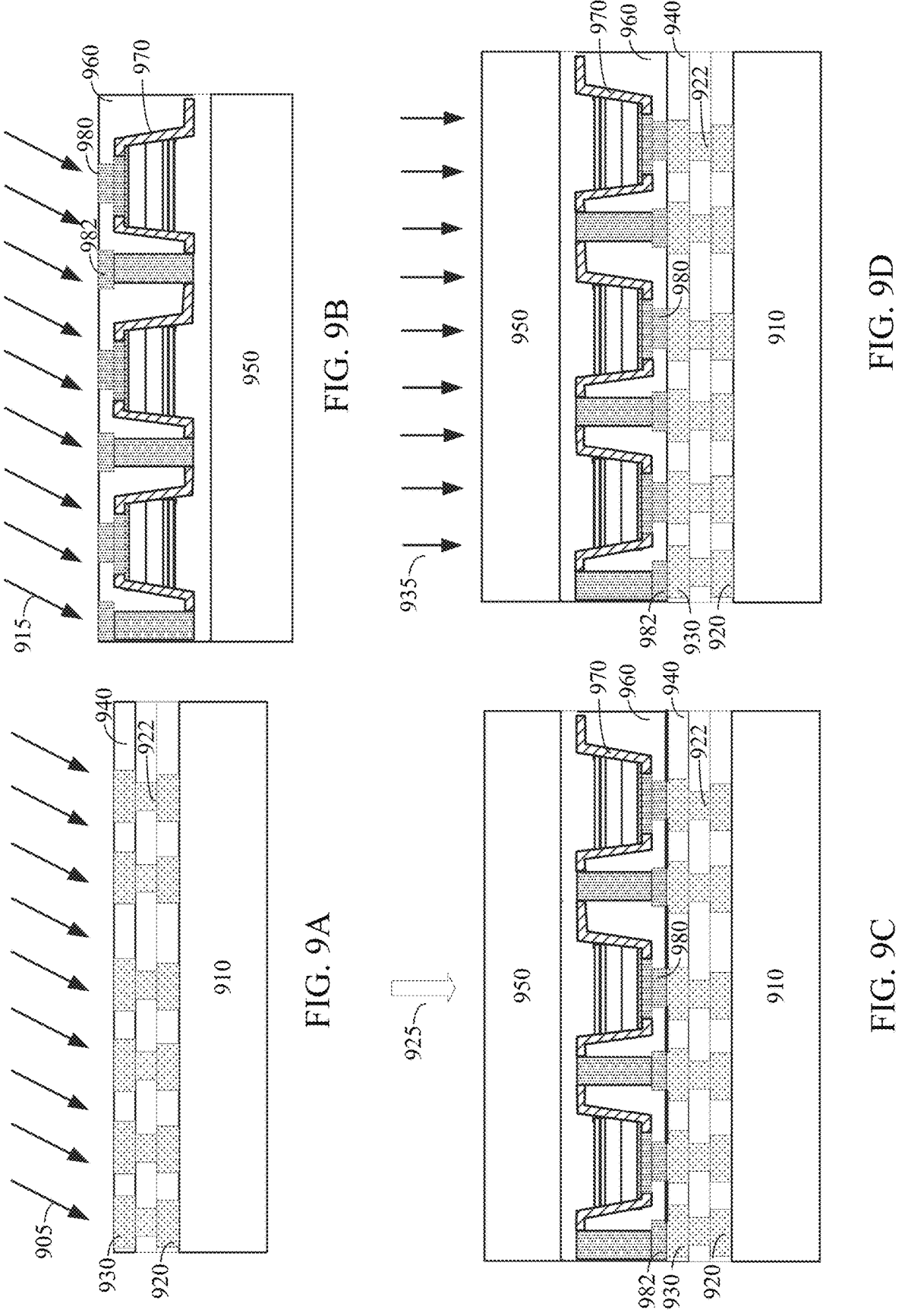
FIGS. 9A-9D illustrate an example of a method of hybrid bonding for arrays of LEDs according to certain embodiments.

FIGS. 9A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, substrate 910 may include, for example, a silicon wafer. Circuits 920 may include driver circuits for the arrays of LEDs. A bonding layer may include dielectric regions 940 and contact pads 930 connected to circuits 920 through electrical interconnects 922. Contact pads 930 may include, for example, Cu, Ag, Au, Al, W, Mo, Ni, Ti, Pt, Pd, or the like. Dielectric materials in dielectric regions 940 may include SiCN, SiO₂, SiN, Al₂O₃, HfO₂, ZrO₂, Ta₂O₅, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 905. The activated surface may be atomically clean and may be reactive for formation of direct bonds between wafers when they are brought into contact, for example, at room temperature.

FIG. 9B illustrates a wafer 950 including an array of micro-LEDs 970 fabricated thereon as described above with respect to, for example, FIGS. 7A-8B. Wafer 950 may be a carrier wafer and may include, for example, GaAs, InP, GaN, AlN, sapphire, SiC, Si, or the like. Micro-LEDs 970 may include an n-type layer, an active region, and a p-type layer epitaxially grown on wafer 950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in dielectric material layer 960 may include, for example, SiCN, SiO₂, SiN, Al₂O₃, HfO₂, ZrO₂, Ta₂O₅, or the like. P-contacts 980 and n-contacts 982 may include, for example, Cu, Ag, Au, Al, W, Mo, Ni, Ti, Pt, Pd, or the like. The top surfaces of p-contacts 980, n-contacts 982, and dielectric material layer 960 may form a bonding layer. The bonding layer may be planarized and polished using, for example, chemical mechanical polishing, where the polishing may cause dishing in p-contacts 980 and n-contacts 982. The bonding layer may then be cleaned and activated by, for example, an ion (e.g., plasma) or fast atom (e.g., Ar) beam 915. The activated surface may be atomically clean and reactive for formation of direct bonds between wafers when they are brought into contact, for example, at room temperature.

FIG. 9C illustrates a room temperature bonding process for bonding the dielectric materials in the bonding layers. For example, after the bonding layer that includes dielectric regions 940 and contact pads 930 and the bonding layer that includes p-contacts 980, n-contacts 982, and dielectric material layer 960 are surface activated, wafer 950 and micro-LEDs 970 may be turned upside down and brought into contact with substrate 910 and the circuits formed thereon. In some embodiments, compression pressure 925 may be applied to substrate 910 and wafer 950 such that the bonding layers are pressed against each other. Due to the surface activation and the dishing in the contacts, dielectric regions 940 and dielectric material layer 960 may be in direct contact because of the surface attractive force, and may react and form chemical bonds between them because the surface atoms may have dangling bonds and may be in unstable energy states after the activation. Thus, the dielectric materials in dielectric regions 940 and dielectric material layer 960 may be bonded together with or without heat treatment or pressure.

FIG. 9D illustrates an annealing process for bonding the contacts in the bonding layers after bonding the dielectric materials in the bonding layers. For example, contact pads 930 and p-contacts 980 or n-contacts 982 may be bonded together by annealing at, for example, about 200-400° C. or higher. During the annealing process, heat 935 may cause the contacts to expand more than the dielectric materials (due to different coefficients of thermal expansion), and thus may close the dishing gaps between the contacts such that contact pads 930 and p-contacts 980 or n-contacts 982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions.

In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 10:
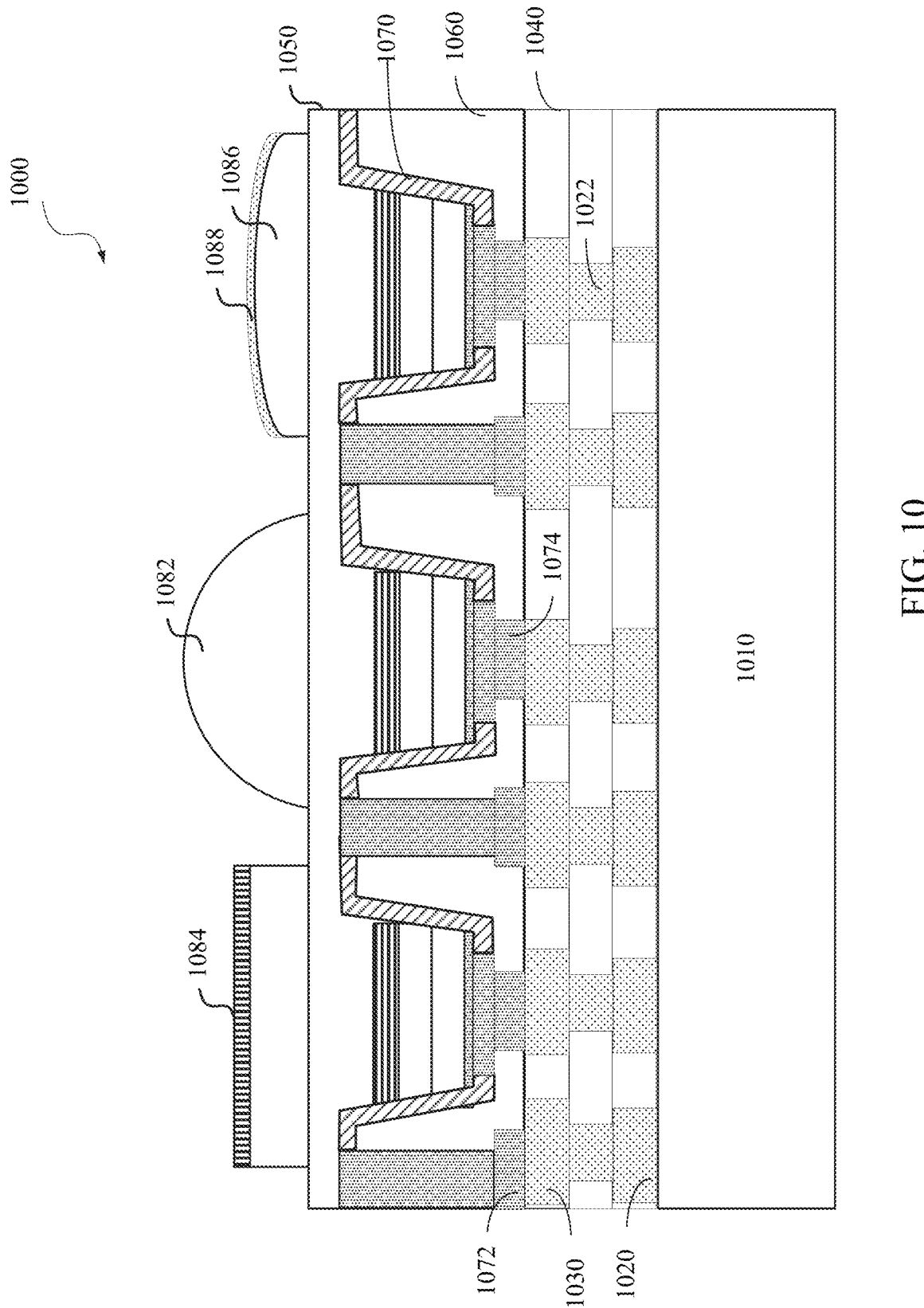
FIG. 10 illustrates an example of an LED array with secondary optical components fabricated thereon according to certain embodiments.

FIG. 10 illustrates an example of an LED array 1000 with secondary optical components fabricated thereon according to certain embodiments. LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, LED array 1000 may be bonded using a wafer-to-wafer hybrid bonding technique as described above with respect to FIG. 9A-9D. LED array 1000 may include a substrate 1010, which may be, for example, a silicon wafer. Integrated circuits 1020, such as LED driver circuits, may be fabricated on substrate 1010. Integrated circuits 1020 may be connected to p-contacts 1074 and n-contacts 1072 of micro-LEDs 1070 through interconnects 1022 and contact pads 1030, where contact pads 1030 may form metallic bonds with p-contacts 1074 and n-contacts 1072. Dielectric layer 1040 on substrate 1010 may be bonded to dielectric layer 1060 through fusion bonding.

The substrate (not shown) of the LED chip or wafer may be thinned or may be removed to expose the n-type layer 1050 of micro-LEDs 1070. Various secondary optical components, such as a spherical micro-lens 1082, a grating 1084, a micro-lens 1086, an antireflection layer 1088, and the like, may be formed in or on top of n-type layer 1050. For example, spherical micro-lens arrays may be etched in the semiconductor materials of micro-LEDs 1070 using a grayscale mask and a photoresist with a linear response to exposure light, or using an etch mask formed by thermal reflowing of a patterned photoresist layer. The secondary optical components may also be etched in a dielectric layer deposited on n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO$_2$, SiN, Al$_2$O$_3$, HfO$_2$, ZrO$_2$, Ta$_2$O$_5$, or the like. In some embodiments, a micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on micro-LEDs 1070, which does not necessary imply that different secondary optical components are used simultaneously for every LED array.

Figures 11A, 11B, 11C, 11D, 11E, 11F:
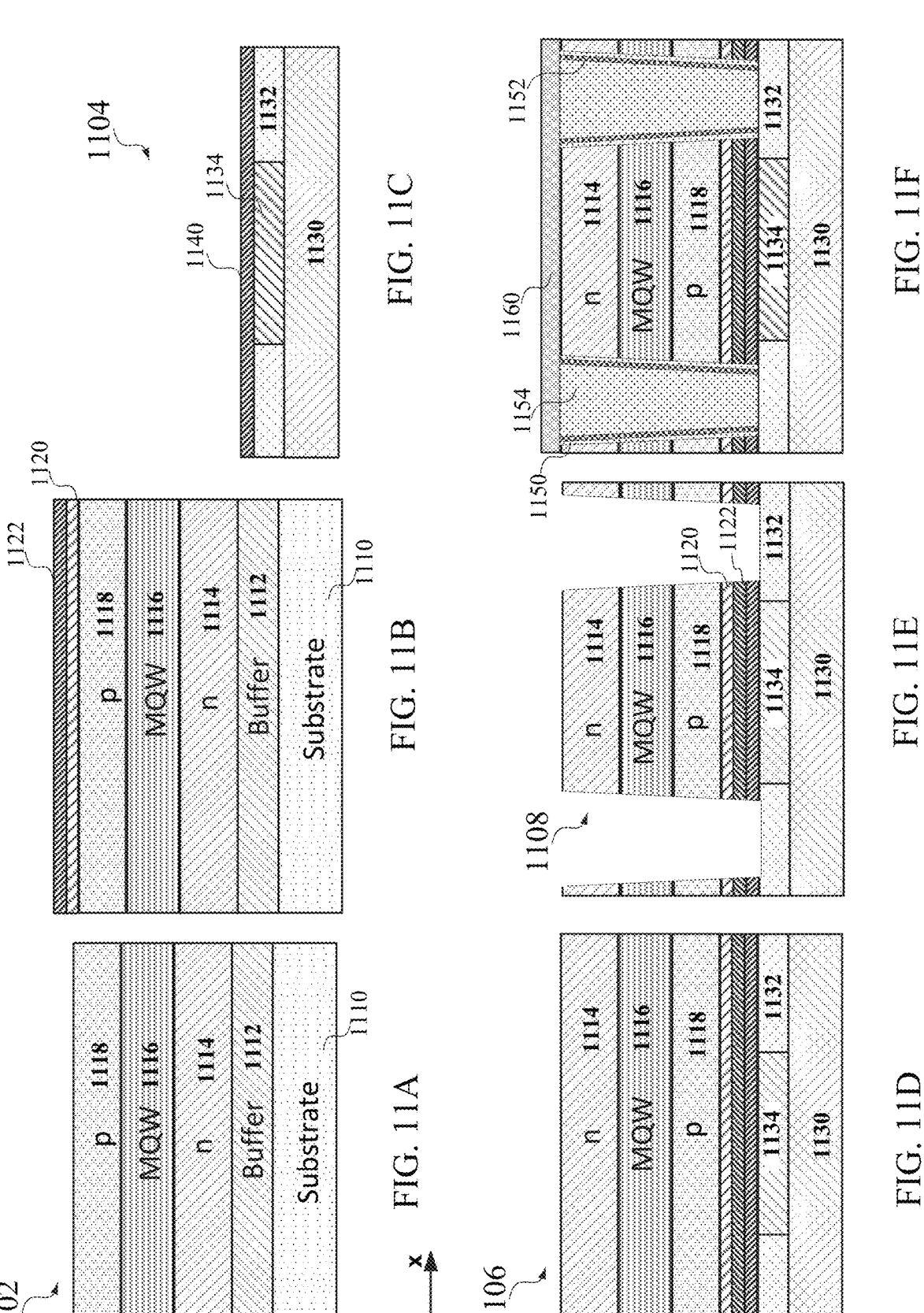
FIGS. 11A-11F illustrate an example of a method of fabricating a micro-LED device using alignment-free metal-to-metal bonding and post-bonding mesa formation.

FIGS. 11A-11F illustrate an example of a method of fabricating a micro-LED device using alignment-free metal-to-metal bonding and post-bonding mesa formation processes. FIG. 11A shows a micro-LED wafer 1102 including epitaxial layers grown on a substrate 1110. As described above, substrate 1110 may include, for example, a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAl$_2$ structure, where the substrate may be cut in a specific direction to expose a specific plane (e.g., a c-plane or a semipolar plane) as the growth surface. In some embodiments, a buffer layer 1112 may be formed on substrate 1110 to improve the lattice matching between the growth substrate and the epitaxial layers, thereby reducing stress and defects in the epitaxial layers. The epitaxial layers may include an n-type semiconductor layer 1114 (e.g., a GaN layer doped with Si or Ge), an active region 1116, and a p-type semiconductor layer 1118 (e.g., a GaN layer doped with Mg, Ca, Zn, or Be). Active region 1116 may include multiple quantum wells or an MQW formed by quantum well layers (e.g., InGaN layer) sandwiched by barrier layers (e.g., GaN layer) as described above. The epitaxial layers may be grown layer-by-layer on substrate 1110 or buffer layer 1112 using techniques such as VPE, LPE, MBE, or MOCVD.

In the epitaxial growth processes, dopants (e.g., Mg) used to dope the p-type semiconductor layer (e.g., Mg-doped GaN layer) may remain in the reactor and/or on the epitaxial surface after the introduction of Mg precursors into the reactor. For example, the source for Mg doping (e.g., bis (cyclopentadienyl) magnesium (Cp$_2$Mg)) may be adsorbed onto reactor lines and walls and may be released in the gas phase in subsequent processes. A surface riding effect can also contribute to the residual Mg due to a Mg-rich layer formed on the surface of the p-GaN layer. Thus, if the quantum-well layers are grown on the Mg-rich p-GaN layer after the growth of the p-GaN layer with Mg dopants, the quantum-well layers may be contaminated with Mg dopants even after the Mg source is turned off, which may be referred to as the Mg-memory effect and may manifest as a slow decay tail of Mg into subsequent epitaxial layers. Mg can contaminate the MQW layers to form non-radiative recombination centers caused by, for example, Mg-related point defects, Mg interstitials, or Mg-related complexes.

In addition, for p-type GaN layers formed using, for example, MOCVD, the dopants (e.g., Mg) may be passivated due to the incorporation of atomic hydrogen (which exists in the form of H$^+$) during growth and the formation of Mg—H complexes. Therefore, a post-growth activation of the dopants is generally performed to release mobile holes. The activation of the dopants in the p-GaN layer may include breaking the Mg—H bonds and driving the H$^+$ out of the p-GaN layer at elevated temperatures (e.g., above 700° C.) to activate the Mg dopants. Insufficient activation of the Mg dopants in the p-GaN layer may lead to an open circuit, a poor performance, or a premature punch-through breakdown of the LED device. If p-type GaN layer is grown before the growth of the active region and the n-type layer, to drive out hydrogen, positively charged $H^+$ ions need to diffuse across the p-n junction and through the n-GaN layer that is exposed. However, because of the depletion field in the p-n junction (with a direction from the n-type layer to the p-type layer), positively charged $H^+$ ions may not be able to diffuse from the p-type layer to the n-type layer across the p-n junction. Furthermore, hydrogen may have a much higher diffusion barrier and thus a much lower diffusivity in n-type GaN compared with in p-type GaN. Thus, the hydrogen ions may not diffuse through the n-type layer to the exposed top surface of the n-type layer. Moreover, the activation may not be performed right after the p-doping and before the growth of the active region either, because the subsequent growth may be performed in the presence of high pressure ammonia ($NH_3$) in order to avoid decomposition of GaN at the high growth temperatures, and thus a semiconductor layer (e.g., the p-type semiconductor layer) that was activated may be re-passivated due to the presence of ammonia.

Therefore, in general, during the growth of the GaN epitaxial layers, n-type semiconductor layer 1114 may be grown first. P-type semiconductor layer 1118 may be grown after the growth of active region 1116 to avoid contamination of active region 1116 and facilitate activation of the dopants in the p-type semiconductor layer.

FIG. 11B shows a reflector layer 1120 and a bonding layer 1122 formed on p-type semiconductor layer 1118. Reflector layer 1120 may include, for example, a metal layer such as an aluminum layer, a silver layer, or a metal alloy layer. In some embodiments, reflector layer 1120 may include a distributed Bragg reflector formed by conductive materials (e.g., semiconductor materials or conductive oxides) or including conductive vias. In some embodiments, reflector layer 1120 may include one or more sublayers. Reflector layer 1120 may be formed on p-type semiconductor layer 1118 in a deposition process. Bonding layer 1122 may include a metal layer, such as a titanium layer, a copper layer, an aluminum layer, a gold layer, or a metal alloy layer. In some embodiments, bonding layer 1122 may include a eutectic alloy, such as Au—In, Au—Sn, Au—Ge, or Ag—In. Bonding layer 1122 may be formed on reflector layer 1120 by a deposition process and may include one or more sublayers.

FIG. 11C shows a backplane wafer 1104 that includes a substrate 1130 with electrical circuits formed thereon. The electrical circuits may include digital and analog pixel drive circuits for driving individual micro-LEDs. A plurality of metal pads 1134 (e.g., copper or tungsten pads) may be formed in a dielectric layer 1132 (e.g., including $SiO_2$ or SiN). In some embodiments, each metal pad 1134 may be an electrode (e.g., anode or cathode) for a micro-LED. In some embodiments, pixel drive circuits for each micro-LED may be formed in an area matching the size of a micro-LED (e.g., about 2 μm×2 μm), where the pixel drive circuits and the micro-LED may collectively form a pixel of a micro-LED display panel. Even though FIG. 11C only shows metal pads 1134 formed in one metal layer in one dielectric layer 1132, backplane wafer 1104 may include two or more metal layers formed in dielectric materials and interconnected by, for example, metal vias, as in many CMOS integrated circuits. In some embodiments, a planarization process, such as a CMP process, may be performed to planarize the exposed surfaces of metal pads 1134 and dielectric layer 1132. A bonding layer 1140 may be formed on dielectric layer 1132 and may be in physical and electrical contact with metal pads 1134. As bonding layer 1122, bonding layer 1140 may include a metal layer, such as a titanium layer, a copper layer, an aluminum layer, a gold layer, a metal alloy layer, or a combination thereof. In some embodiments, bonding layer 1140 may include a eutectic alloy. In some embodiments, only one of bonding layer 1140 or bonding layer 1122 may be used.

FIG. 11D shows that micro-LED wafer 1102 and back-plane wafer 1104 may be bonded together to form a wafer stack 1106. Micro-LED wafer 1102 and backplane wafer 1104 may be bonded by the metal-to-metal bonding of bonding layer 1122 and bonding layer 1140. The metal-to-metal bonding may be based on chemical bonds between the metal atoms at the surfaces of the metal bonding layers. The metal-to-metal bonding may include, for example, thermocompression bonding, eutectic bonding, or transient liquid phase (TLP) bonding. The metal-to-metal bonding process may include, for example, surface planarization, wafer cleaning (e.g., using plasma or solvents) at room temperatures, and compression and annealing at elevated temperatures, such as about 250° C. or higher, to cause diffusion of atoms. In eutectic bonding, a eutectic alloy including two or more metals and with a eutectic point lower than the melting point of the two or more metals may be used for low-temperature wafer bonding. Because the eutectic alloy may become a liquid at the elevated temperature, eutectic bonding may be less sensitive to surface flatness irregularities, scratches, particles contamination, and the like. After the bonding, buffer layer 1112 and substrate 1110 may be thinned or removed by, for example, etching, back grinding, or laser lifting, to expose n-type semiconductor layer 1114.

FIG. 11E shows that wafer stack 1106 may be etched from the side of the exposed n-type semiconductor layer 1114 to form mesa structures 1108 for individual micro-LEDs. As shown in FIG. 11E, the etching may include etching through n-type semiconductor layer 1114, active region 1116, p-type semiconductor layer 1118, reflector layer 1120, and bonding layers 1122 and 1140, in order to singulate and electrically isolate mesa structures 1108. Thus, each singulated mesa structure 1108 may include n-type semiconductor layer 1114, active region 1116, p-type semiconductor layer 1118, reflector layer 1120, and bonding layers 1122 and 1140. To perform the etching, an etch mask layer may be formed on n-type semiconductor layer 1114. The etch mask layer may be patterned by aligning a photomask with the backplane wafer (e.g., using alignment marks on backplane wafer 1104) such that the patterned etch mask formed in the etch mask layer may align with metal pads 1134. Therefore, regions of the epitaxial layers and bonding layers above metal pads 1134 may not be etched. Dielectric layer 1132 may be used as the etch-stop layer for the etching. Even though FIG. 11E shows that mesa structures 1108 have substantially vertical sidewalls, mesa structures 1108 may have other shapes as described above, such as a conical shape, a parabolic shape, or a truncated pyramid shape.

FIG. 11F shows that a passivation layer 1150 may be formed on sidewalls of mesa structures 1108, and a sidewall reflector layer 1152 may be formed on passivation layer 1150. Passivation layer 1150 may include a dielectric layer (e.g., $SiO_2$, SiN, or $Al_2O_3$) or an undoped semiconductor layer. Sidewall reflector layer 1152 may include, for example, a metal (e.g., Al) or a metal alloy. In some embodiments, gaps between mesa structures 1108 may be filled with a dielectric material 1154 and/or a metal. Passivation layer 1150, sidewall reflector layer 1152, and/or dielectric material 1154 may be formed using suitable deposition techniques, such as chemical vapor deposition (CVD), physical vapor deposition (PVD), plasma-enhanced chemical vapor deposition (PECVD), atomic-layer deposition (ALD), laser metal deposition (LMD), or sputtering. In some embodiments, sidewall reflector layer 1152 may fill the gaps between mesa structures 1108. In some embodiments, a planarization process may be performed after the deposition of passivation layer 1150, sidewall reflector layer 1152, and/or dielectric material 1154. A common electrode layer 1160, such as a transparent conductive oxide (TCO) layer (e.g., an ITO layer) or a thin metal layer that may be transparent to light emitted in active region 1116, may be formed on the n-type semiconductor layer 1114 to form n-contacts and a common-cathode for the micro-LEDs.

Figure 12:
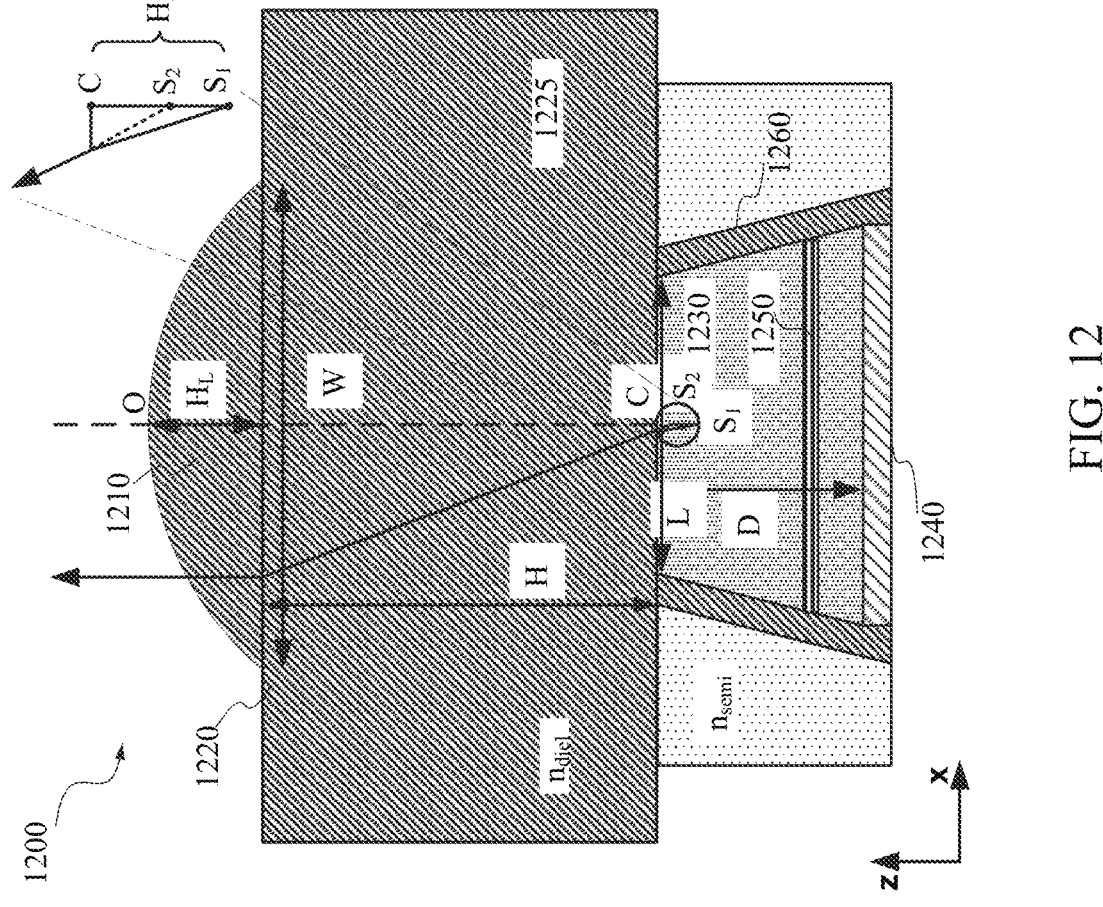
FIG. 12 illustrates an example of a micro-LED with a micro-lens according to certain embodiments.

FIG. 12 illustrates an example of micro-LED 1200 with micro-lens 1210 according to certain embodiments. In the example illustrated in FIG. 12, micro-LED 1200 may include a mesa structure 1230 that may be inwardly tilted in the light emitting direction (e.g., with a tilt angle about 10° to about 25°). In some embodiments, mesa structure 1230 may include vertical or outwardly tilted sidewalls. Mesa structure 1230 includes semiconductor materials (e.g., III-nitride or III-phosphide materials) having a refractive index $n_{semi}$, where the semiconductor materials may have a total thickness D and may include an active region 1250 and p and n regions. Mesa structure 1230 may have a lateral size L (e.g., width or diameter) at a top surface (e.g., the interface between a dielectric layer 1220 and mesa structure 1230). Active region 1250 may include one or more heterostructures, such as one or more quantum wells or MQWs. As described above, mesa structure 1230 may also include a metal contact 1240 (e.g., p-contact, which may also function as a back reflector) and reflective sidewalls 1260 (e.g., including a metal reflector).

Dielectric layer 1220 may be deposited on mesa structure 1230 and may include a dielectric material with a refractive index mid, such as $SiO_2$, $Si_3N_4$, $TiO_2$, $Al_2O_3$, HfO, AlN, or the like. Dielectric layer 1220 may include a spacer layer 1225 having a thickness of H. Micro-lens 1210 may be formed in or on dielectric layer 1220 (e.g., disposed on spacer layer 1225) and may be vertically displaced from mesa structure 1230 (e.g., by the thickness H of spacer layer 1225). In some embodiments, spacer layer 1225 may include a same material as micro-lens 1210. In some embodiments, a transparent conductive layer (not shown) including a thin film of indium tin oxide (ITO), Al, Ni, Au, or a combination thereof may be disposed between mesa structure 1230 and dielectric layer 1220 (e.g., spacer layer 1225).

In some embodiments, micro-lens 1210 may include a spherical lens having a radius R, a lateral size W (e.g., diameter), and a thickness $H_L$. In general, to improve the light extraction efficiency, the lateral size W of micro-lens 1210 may need to be larger/greater than about 150% of the lateral size L of the top surface of mesa structure 1230, such that the light emitting aperture of micro-LED 1200 may be close to a point source with respect to micro-lens 1210. For example, the lateral size W of micro-lens 1210 may be equal to or smaller than 3 μm and the lateral size L of the top surface of mesa structure 1230 may be equal to or smaller than 1 μm.

In the example illustrated in FIG. 12, micro-lens 1210 may be a plano-convex spherical lens. As shown in FIG. 12, the focal point of micro-lens 1210 may be located at a point $S_1$ in the semiconductor materials in mesa structure 1230, and the effective focal point of micro-lens 1210 in dielectric layer 1220 may be at a point $S_2$. The focal length of micro-lens 1210 in free space may be determined by:

$$f = \frac{R}{n_{diel} - n_{air}}.$$

In some embodiments, in order to achieve a high light extraction efficiency for the collected light (e.g., light within a small emission cone, such as within about ±18.5°), micro-LED 1200 may be designed such that point $S_2$ may be located close to the interface between dielectric layer 1220 and mesa structure 1230 (e.g., at the top surface of mesa structure 1230, $F \cong H_L + H$). For example, the thickness H of spacer layer 1225 in dielectric layer 1220 may be equal to or greater than 2 times of the thickness D of the semiconductor materials in mesa structure 1230. In some embodiments, the thickness D of the semiconductor materials in mesa structure 1230 may be about the wavelength of the light emitted by micro-LED 1200 (e.g., emitted from active region 1250).

Figures 13A, 13B:
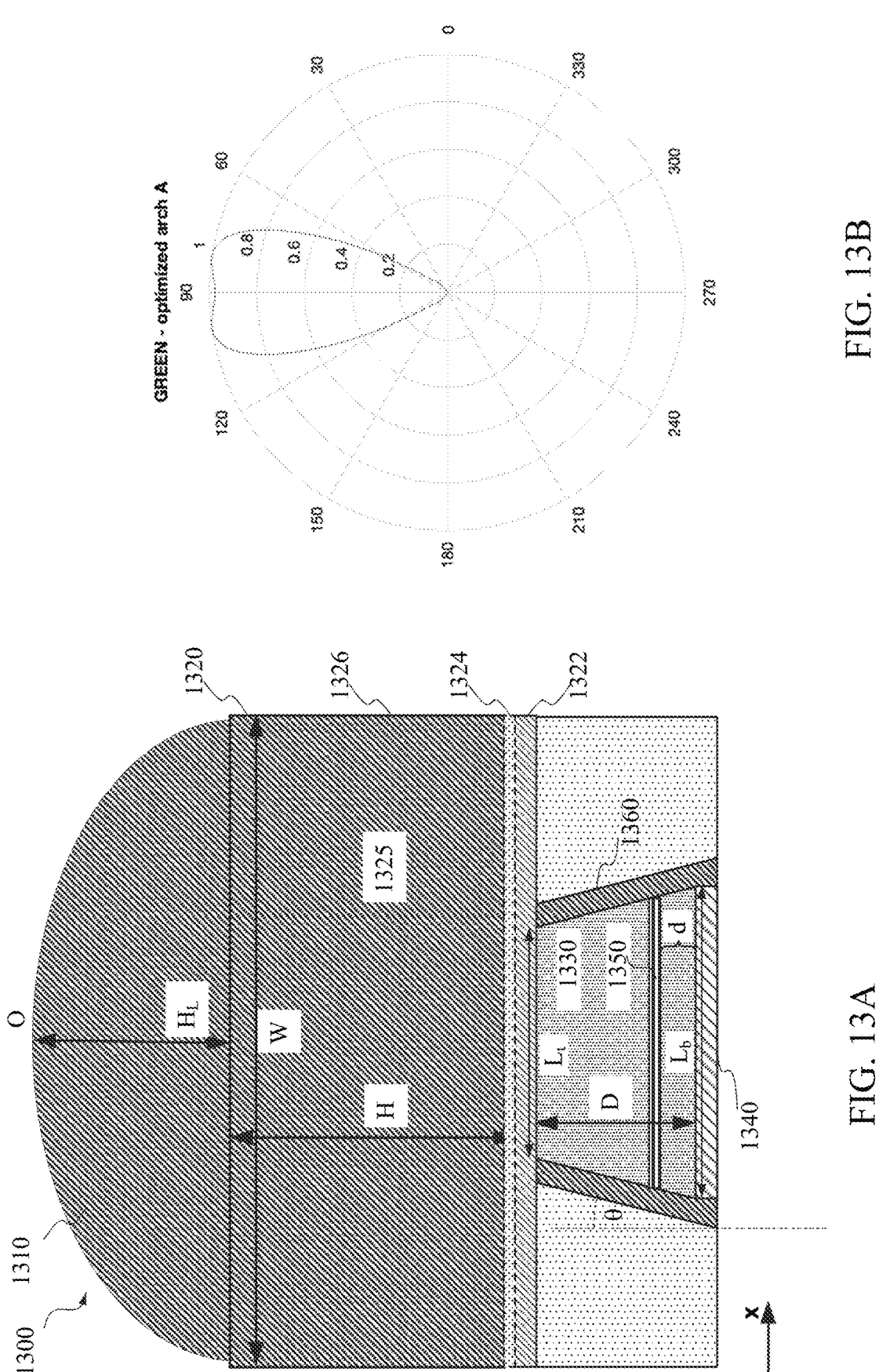
FIG. 13A illustrates an example of a green light-emitting micro-LED with a micro-lens according to certain embodiments.
FIG. 13B illustrates a simulated beam profile of light extracted from the micro-LED with the micro-lens according to certain embodiments.

FIG. 13A illustrates an example of a micro-LED 1300 according to certain embodiments. In the illustrated example, micro-LED 1300 may be configured to emit green light and may have a structure same as or similar to the structure of micro-LED 1200. Micro-LED 1300 may include a semiconductor mesa structure 1330, a transparent conductive layer 1322, a dielectric layer 1320, and a micro-lens 1310 formed in or on dielectric layer 1320. Semiconductor mesa structure 1330 may include inwardly tilted sidewalls, vertical sidewalls, or outwardly tilted sidewalls. In the example illustrated in FIG. 13A, semiconductor mesa structure 1330 may include inwardly tilted sidewalls. In some embodiments, to improve the light extraction efficiency, the lateral size W of micro-lens 1310 may be larger/greater than about 200% of the lateral size $L_t$ of the top surface of semiconductor mesa structure 1330, such that the light emitting aperture of the micro-LED 1300 (e.g., top surface of semiconductor mesa structure 1330) may be close to a point source with respect to micro-lens 1310. In the example shown in FIG. 13A, semiconductor mesa structure 1330 may have a lateral size $L_t$ of about 0.95 μm at the top surface of semiconductor mesa structure 1330, a lateral size $L_b$ of about 1.08 μm at a bottom surface of semiconductor mesa structure 1330, and a tilt angle θ of about 9° with respect to the surface-normal direction of the bottom surface of semiconductor mesa structure 1330. Micro-lens 1310 may include a SiN micro-lens and may have a lateral size W of about 2 μm and a height $H_L$ of about 600 nm.

In order to achieve a high light extraction efficiency for the collected light (e.g., light within a small emission cone such as within about ±18.5°), the thickness H of a spacer layer 1325 may be equal to or greater than about 3 times of the thickness D of the semiconductor materials in semiconductor mesa structure 1330. In some embodiments, the thickness D of the semiconductor materials in semiconductor mesa structure 1330 may be about the wavelength of the light emitted by micro-LED 1300 (e.g., from an active region 1350). In the example shown in FIG. 13A, semiconductor mesa structure 1330 may include semiconductor materials such as GaN and have a thickness D of about 400 nm which is about or smaller than the wavelength of the light emitted by micro-LED 1300 (e.g., green light having a wavelength of 550 nm). Spacer layer 1325 may have a thickness H of about 1.4 μm, which is greater than 3 times the thickness D of semiconductor mesa structure 1330.

In the example shown in FIG. 13A, a contact 1340 (e.g., p-contact) and a sidewall reflector 1360 formed at the bottom surface and sidewalls of semiconductor mesa structure 1330 may include Al. Sidewall reflector 1360 may have a thickness of about 60 nm. A distance d between active region 1350 and contact 1340 in the light emitting direction may be about 155 nm. In some embodiments, dielectric layer 1320 may include, for example, $SiO_2$, $TiO_2$, $Al_2O_3$, SiN, HfO, AlN, or a combination thereof. In some embodiments, a semiconductor layer, rather than dielectric layer 1320, may be used as the spacer layer and/or may be used to form micro-lens 1310. In some embodiments, micro-lens 1310 may be formed in dielectric layer 1320 and on spacer layer 1325, and thus spacer layer 1325 may include a same material as micro-lens 1310.

In some embodiments, spacer layer 1325 may include a first sub-layer 1326 and a second sub-layer 1324. First sub-layer 1326 may include SiN (e.g., the same material as micro-lens 1310) and may have a thickness that is equal to or greater than about 2 times of the thickness D of the semiconductor materials in semiconductor mesa structure 1330. In some embodiments, second sub-layer 1324 may include $SiO_2$ and may be between transparent conductive layer 1322 and first sub-layer 1326. Transparent conductive layer 1322 may be between dielectric layer 1320 (e.g., spacer layer 1325) and semiconductor mesa structure 1330 and may function as a contact (e.g., n-contact). Transparent conductive layer 1322 may include a thin film of indium tin oxide (ITO), Al, Ni, Au, or a combination thereof.

In the example shown in FIG. 13A, first sub-layer 1326 may have a thickness of about 1.2 μm, second sub-layer 1324 may have a thickness of about 20 nm, and transparent conductive layer 1322 may have a thickness of about 125 nm. In some embodiments, micro-LED 1300 may further include an anti-reflective coating (not shown in FIG. 13A) applied to the surface of micro-lens 1310. In the example shown in FIG. 13A, the anti-reflective coating may have a thickness of about 125 nm.

FIG. 13B illustrates a simulated beam profile of the light beam extracted from micro-LED 1300 of FIG. 13A by micro-lens 1310 according to certain embodiments. The total light extraction efficiency of micro-LED 1300 may be about 27.31%. The collected light extraction efficiency of micro-LED 1300 may be about 10.11% within the ±18.5° acceptance angle range, and thus the ratio between the collected light extraction efficiency and the total light extraction efficiency may be about 37.02%. In contrast, a micro-LED with a thin spacer layer (e.g., about 0.2 μm), a large semiconductor mesa structure (e.g., a lateral size $L_t$ of about 1.2 μm at the top surface of the semiconductor mesa structure, a lateral size $L_b$ of about 1.4 μm at the bottom surface of the semiconductor mesa structure, and a thickness about 800 nm), and other parameters similar to the parameters of micro-LED 1300 may have a total LEE about 24.24% and a collected LEE only about 2.42%. As such, because of the design (e.g., aspect ratios) of the micro-LED disclosed herein, the collected light extraction efficiency of micro-LED 1300 and the ratio between the collected LEE and the total LEE of micro-LED 1300 are both significantly increased compared with existing micro-LEDs with different designs (e.g., aspect ratios).

Figures 14A, 14B:
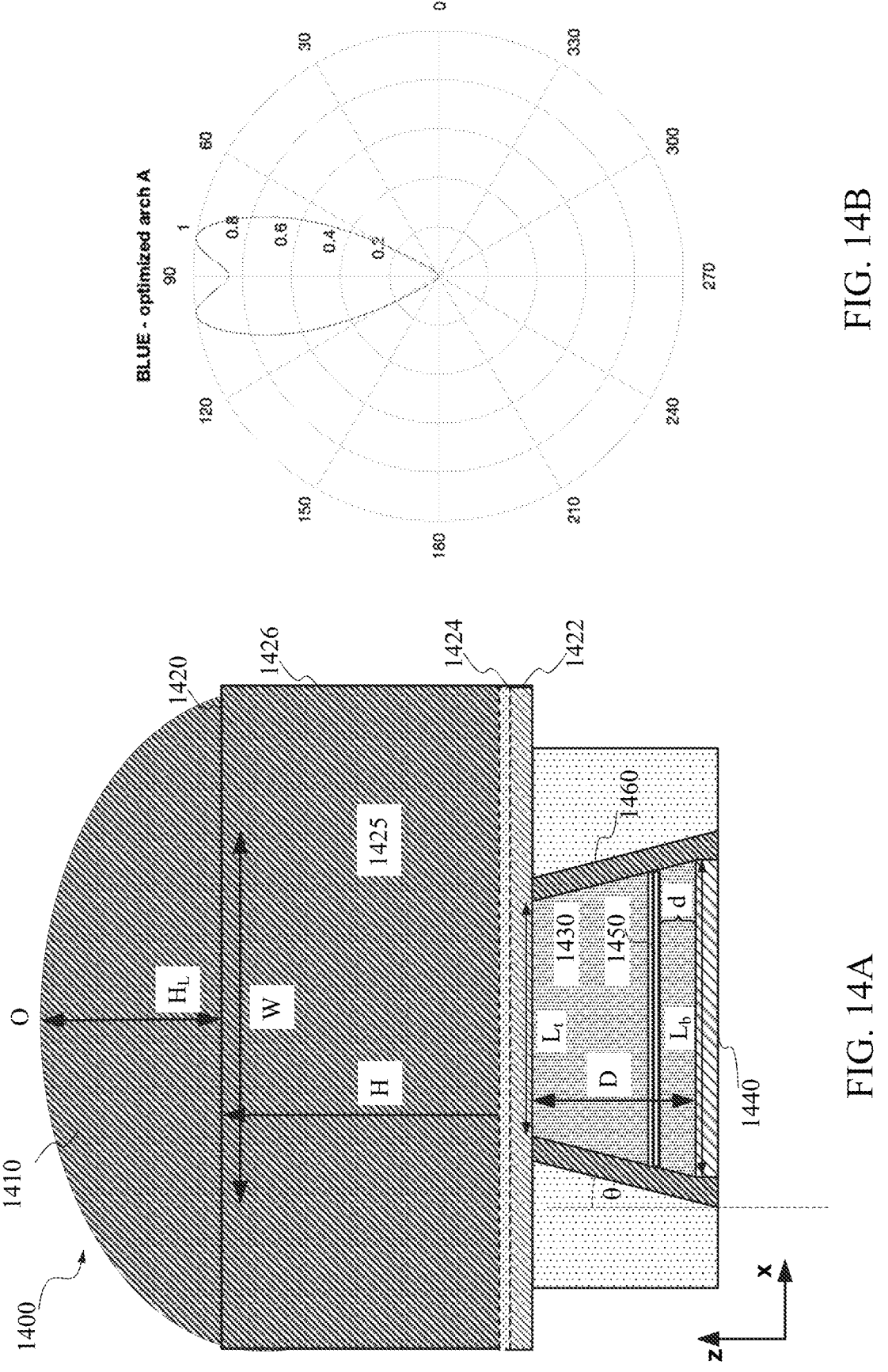
FIG. 14A illustrates an example of a blue light-emitting micro-LED with a micro-lens according to certain embodiments.
FIG. 14B illustrates a simulated beam profile of light extracted from the micro-LED with the micro-lens according to certain embodiments.

FIG. 14A illustrates an example of a micro-LED 1400 according to certain embodiments. In the illustrated example, micro-LED 1400 may be configured to emit blue light and may have a structure same as or similar to the structure of micro-LED 1200. Micro-LED 1400 may include a semiconductor mesa structure 1430, a transparent conductive layer 1422, a dielectric layer 1420, and a micro-lens 1410 formed in or on dielectric layer 1420. Semiconductor mesa structure 1430 may include inwardly tilted sidewalls, vertical sidewalls, or outwardly tilted sidewalls. In the example illustrated in FIG. 14A, semiconductor mesa structure 1430 may include inwardly tilted sidewalls. In some embodiments, to improve the light extraction efficiency, the lateral size W of micro-lens 1410 may be larger/greater than about 200% of the lateral size $L_t$ of the top surface of semiconductor mesa structure mesa structure 1430, such that the light emitting aperture of the micro-LED 1400 (e.g., top surface of semiconductor mesa structure 1430) may be close to a point source with respect to micro-lens 1410. In the example shown in FIG. 14A, semiconductor mesa structure 1430 may have a lateral size $L_t$ of about 0.83 μm at the top surface of semiconductor mesa structure 1430, a lateral size $L_b$ of about 1.08 μm at a bottom surface of inward-tilted semiconductor mesa structure 1430, and a tilt angle θ of 13° from the normal of the bottom surface of inward-tilted semiconductor mesa structure 1430. A micro-lens 1410 may include a SiN micro-lens and may have a lateral size W of about 2 μm and a height $H_L$ of about 600 nm.

In order to achieve a high light extraction efficiency for the collected light (e.g., light within a small emission cone such as within about ±18.5°), the thickness H of a spacer layer 1425 may be equal to or greater than about 2 times of the thickness D of semiconductor materials in semiconductor mesa structure 1430. In some embodiments, the thickness D of the semiconductor materials in semiconductor mesa structure 1430 may be about the wavelength of the light emitted by micro-LED 1400 (e.g., from an active region 1450). In the example shown in FIG. 14A, semiconductor mesa structure 1430 may include semiconductor materials such as GaN and have a thickness D of 550 nm which is close to the wavelength of the light emitted by micro-LED 1400 (e.g., blue light having a wavelength of about 450 nm). Spacer layer 1425 may have a thickness H of about 1.3 μm, which is greater than 2 times the thickness D of the semiconductor materials in semiconductor mesa structure 1430.

In the example shown in FIG. 14A, a contact 1440 (e.g., p-contact) and a sidewall reflector 1460 formed at the bottom surface and sidewalls of semiconductor mesa structure 1430 may include Al. Sidewall reflector 1460 may have a thickness of about 60 nm. A distance d between active region 1450 and contact 1440 in the light emitting direction may be about 125 nm. In some embodiments, dielectric layer 1420 may include, for example, $SiO_2$, $TiO_2$, $Al_2O_3$, SiN, HfO, AlN, or a combination thereof. In some embodiments, a semiconductor layer, rather than dielectric layer 1420, may be used as the spacer layer and/or may be used to form micro-lens 1410. In some embodiments, micro-lens 1410 may be formed in dielectric layer 1420 and on spacer layer 1425, and thus spacer layer 1425 may include a same material as micro-lens 1410.

In some embodiments, spacer layer 1425 may include a first sub-layer 1426 and a second sub-layer 1424. First sub-layer 1426 may include SiN (e.g., the same material as micro-lens 1410) and may have a thickness that is equal to or greater than about 2 times of the thickness D of the semiconductor materials in semiconductor mesa structure 1430. In some embodiments, second sub-layer 1424 may include SiO2 and may be between transparent conductive layer 1422 and first sub-layer 1426. Transparent conductive layer 1422 may be between dielectric layer 1420 (e.g., spacer layer 1425) and semiconductor mesa structure 1430 and may function as a contact (e.g., n-contact), separating dielectric layer 1420 and inward-tilted semiconductor mesa structure 1430. Transparent conductive layer 1422 may include a thin film of indium tin oxide (ITO), Al, Ni, Au, or a combination thereof.

In the example shown in FIG. 14A, first sub-layer 1426 may have a thickness of about 1.1 μm, second sub-layer 1424 may have a thickness of about 20 nm, and transparent conductive layer 1422 may have a thickness of about 100 nm. In some embodiments, micro-LED 1400 may further include an anti-reflective coating (not shown in FIG. 14A) applied to the surface of micro-lens 1410. In the example shown in FIG. 14A, the anti-reflective coating may have a thickness of about 100 nm.

FIG. 14B illustrates a simulated beam profile of the light beam extracted from micro-LED 1400 of FIG. 14A micro-lens 1410 according to certain embodiments. The total light extraction efficiency of micro-LED 1400 may be about 25.64%. The collected light extraction efficiency of micro-LED 1400 may be about 10.45% within the ±18.5° acceptance angle range, and thus the ratio between the collected light extraction efficiency and the total light extraction efficiency may be about 40.76%. As such, because of the design (e.g., aspect ratios) of the micro-LED disclosed herein, the collected light extraction efficiency of micro-LED 1400 and the ratio between the collected LEE and the total LEE of micro-LED 1400 are both significantly increased compared with existing micro-LEDs.

Figures 15A, 15B:
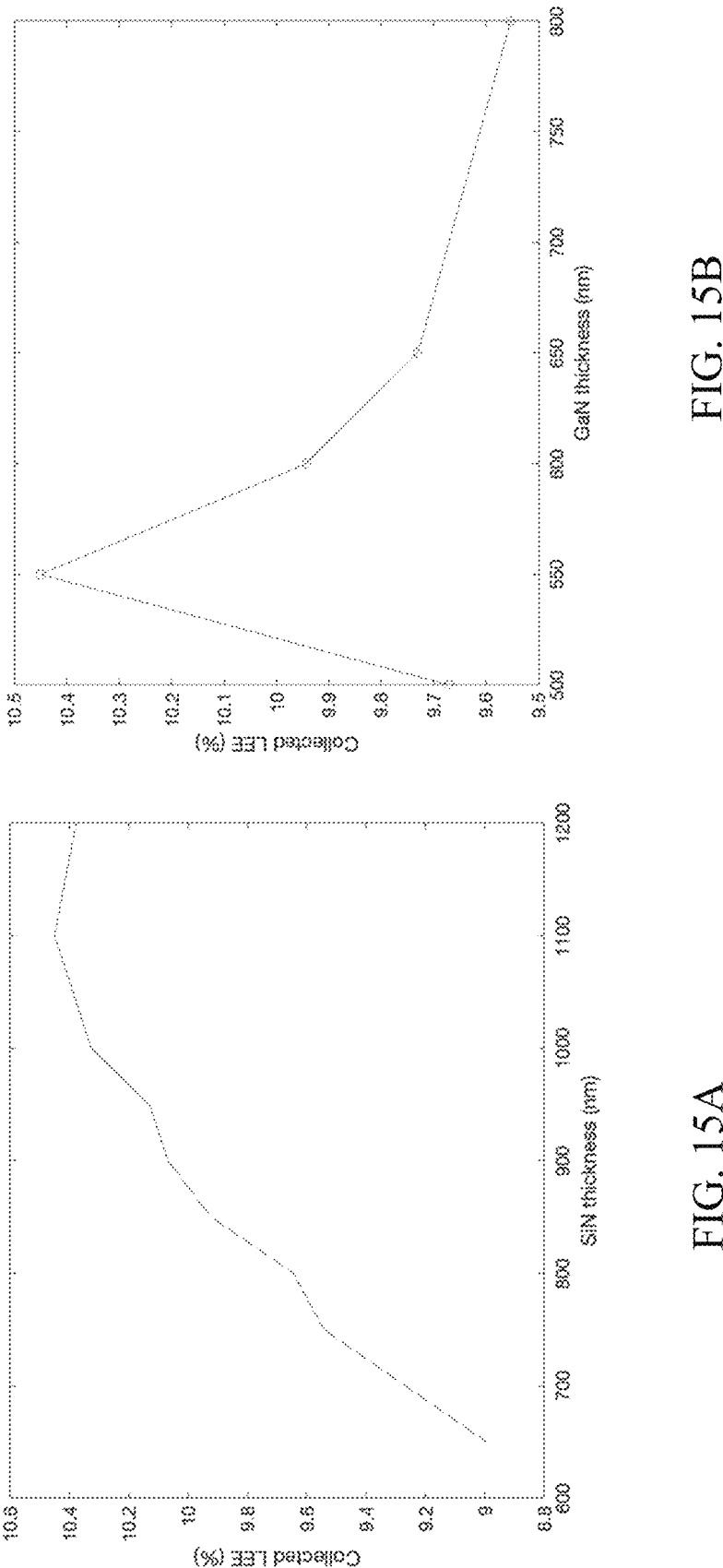
FIG. 15A illustrates simulated light extraction efficiencies for examples of blue light-emitting micro-LEDs with different spacer layer thicknesses according to certain embodiments.
FIG. 15B illustrates simulated light extraction efficiencies for examples of blue light-emitting micro-LEDs with different semiconductor layer thicknesses according to certain embodiments.

FIG. 15A illustrates simulated light extraction efficiencies for examples of blue light-emitting micro-LEDs with different spacer layer thicknesses according to certain embodiments. FIG. 15B illustrates simulated light extraction efficiencies for examples of blue light emitting micro-LEDs with different semiconductor layer thicknesses according to certain embodiments. In the examples shown in FIG. 15A, the micro-LEDs have spacer layer thicknesses between about 650 nm and about 1.2 μm in the dielectric materials (e.g., dielectric material 1420 shown in FIG. 14A) and a same semiconductor layer thickness in the semiconductor mesa structure (e.g., semiconductor mesa structure 1430 in FIG. 14A). In the examples shown in FIG. 15B, the micro-LEDs have semiconductor layer thicknesses between about 550 nm and about 800 nm in the semiconductor mesa structure (e.g., semiconductor mesa structure 1430 shown in FIG. 14A) and a same spacer layer thickness in the dielectric materials (e.g., dielectric material 1420 shown in FIG. 14A). In FIG. 15A, the horizontal axis corresponds to the spacer layer thickness in the dielectric materials and the vertical axis corresponds to the collected light extraction efficiency (e.g., the light extraction efficiency of light within the ±18.5° acceptance angle range). In FIG. 15B, the horizontal axis corresponds to the semiconductor layer thickness in the semiconductor mesa structure and the vertical axis corresponds to the collected light extraction efficiency (e.g., the light extraction efficiency of light within the ±18.5° acceptance angle range). In the examples shown in FIGS. 15A and 15B, the collected light extraction efficiency may be the highest when the spacer layer thickness is between about 1.0-1.2 μm (e.g., about 1.1 μm) and when the semiconductor layer thickness is about 550 nm.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 16:
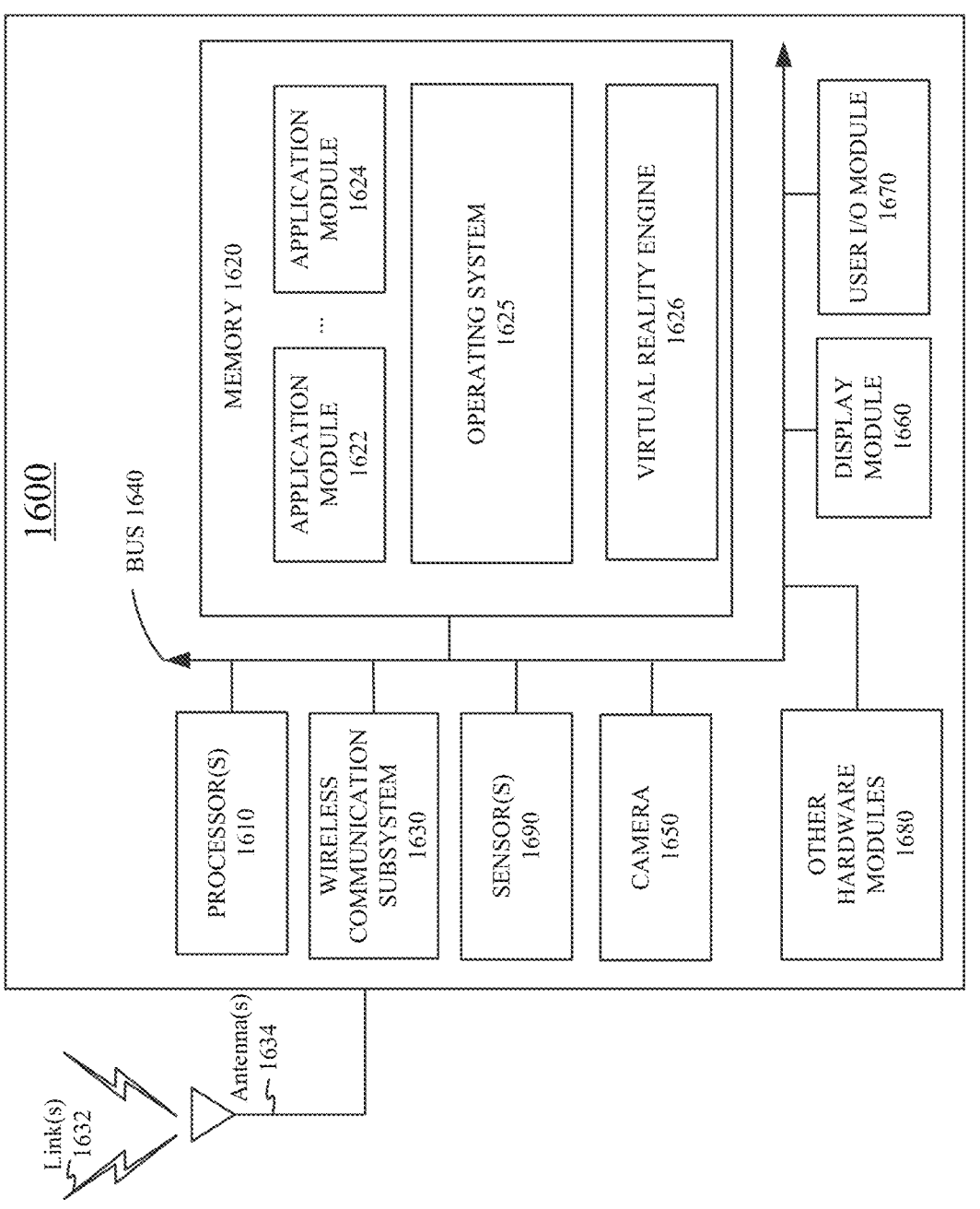
FIG. 16 is a simplified block diagram of an electronic system of an example of a near-eye display according to certain embodiments.

FIG. 16 is a simplified block diagram of an example electronic system 1600 of an example near-eye display (e.g., HMD device) for implementing some of the examples disclosed herein. Electronic system 1600 may be used as the electronic system of an HMD device or other near-eye displays described above. In this example, electronic system 1600 may include one or more processor(s) 1610 and a memory 1620. Processor(s) 1610 may be configured to execute instructions for performing operations at a number of components, and can be, for example, a general-purpose processor or microprocessor suitable for implementation within a portable electronic device. Processor(s) 1610 may be communicatively coupled with a plurality of components within electronic system 1600. To realize this communicative coupling, processor(s) 1610 may communicate with the other illustrated components across a bus 1640. Bus 1640 may be any subsystem adapted to transfer data within electronic system 1600. Bus 1640 may include a plurality of computer buses and additional circuitry to transfer data.

Memory 1620 may be coupled to processor(s) 1610. In some embodiments, memory 1620 may offer both short-term and long-term storage and may be divided into several units. Memory 1620 may be volatile, such as static random access memory (SRAM) and/or dynamic random access memory (DRAM) and/or non-volatile, such as read-only memory (ROM), flash memory, and the like. Furthermore, memory 1620 may include removable storage devices, such as secure digital (SD) cards. Memory 1620 may provide storage of computer-readable instructions, data structures, program modules, and other data for electronic system 1600. In some embodiments, memory 1620 may be distributed into different hardware modules. A set of instructions and/or code might be stored on memory 1620. The instructions might take the form of executable code that may be executable by electronic system 1600, and/or might take the form of source and/or installable code, which, upon compilation and/or installation on electronic system 1600 (e.g., using any of a variety of generally available compilers, installation programs, compression/decompression utilities, etc.), may take the form of executable code.

In some embodiments, memory 1620 may store a plurality of application modules 1622 through 1624, which may include any number of applications. Examples of applications may include gaming applications, conferencing applications, video playback applications, or other suitable applications. The applications may include a depth sensing function or eye tracking function. Application modules 1622-1624 may include particular instructions to be executed by processor(s) 1610. In some embodiments, certain applications or parts of application modules 1622-1624 may be executable by other hardware modules 1680. In certain embodiments, memory 1620 may additionally include secure memory, which may include additional security controls to prevent copying or other unauthorized access to secure information.

In some embodiments, memory 1620 may include an operating system 1625 loaded therein. Operating system 1625 may be operable to initiate the execution of the instructions provided by application modules 1622-1624 and/or manage other hardware modules 1680 as well as interfaces with a wireless communication subsystem 1630 which may include one or more wireless transceivers. Operating system 1625 may be adapted to perform other operations across the components of electronic system 1600 including threading, resource management, data storage control and other similar functionality.

Wireless communication subsystem 1630 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1600 may include one or more antennas 1634 for wireless communication as part of wireless communication subsystem 1630 or as a separate component coupled to any portion of the system. Depending on desired functionality, wireless communication subsystem 1630 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1630 may permit data to be exchanged with a network, other computer systems, and/or any other devices described herein. Wireless communication subsystem 1630 may include a means for transmitting or receiving data, such as identifiers of HMD devices, position data, a geographic map, a heat map, photos, or videos, using antenna(s) 1634 and wireless link(s) 1632. Wireless communication subsystem 1630, processor(s) 1610, and memory 1620 may together comprise at least a part of one or more of a means for performing some functions disclosed herein.

Embodiments of electronic system 1600 may also include one or more sensors 1690. Sensor(s) 1690 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1690 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1600 may include a display module 1660. Display module 1660 may be a near-eye display, and may graphically present information, such as images, videos, and various instructions, from electronic system 1600 to a user. Such information may be derived from one or more application modules 1622-1624, virtual reality engine 1626, one or more other hardware modules 1680, a combination thereof, or any other suitable means for resolving graphical content for the user (e.g., by operating system 1625). Display module 1660 may use LCD technology, LED technology (including, for example, OLED, ILED, μ-LED, AMO-LED, TOLED, etc.), light emitting polymer display (LPD) technology, or some other display technology.

Electronic system 1600 may include a user input/output module 1670. User input/output module 1670 may allow a user to send action requests to electronic system 1600. An action request may be a request to perform a particular action. For example, an action request may be to start or end an application or to perform a particular action within the application. User input/output module 1670 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1600. In some embodiments, user input/output module 1670 may provide haptic feedback to the user in accordance with instructions received from electronic system 1600. For example, the haptic feedback may be provided when an action request is received or has been performed.

Electronic system 1600 may include a camera 1650 that may be used to take photos or videos of a user, for example, for tracking the user's eye position. Camera 1650 may also be used to take photos or videos of the environment, for example, for VR, AR, or MR applications. Camera 1650 may include, for example, a complementary metal-oxide-semiconductor (CMOS) image sensor with a few millions or tens of millions of pixels. In some implementations, camera 1650 may include two or more cameras that may be used to capture 3-D images.

In some embodiments, electronic system 1600 may include a plurality of other hardware modules 1680. Each of other hardware modules 1680 may be a physical module within electronic system 1600. While each of other hardware modules 1680 may be permanently configured as a structure, some of other hardware modules 1680 may be temporarily configured to perform specific functions or temporarily activated. Examples of other hardware modules 1680 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1680 may be implemented in software.

In some embodiments, memory 1620 of electronic system 1600 may also store a virtual reality engine 1626. Virtual reality engine 1626 may execute applications within electronic system 1600 and receive position information, acceleration information, velocity information, predicted future positions, or any combination thereof of the HMD device from the various sensors. In some embodiments, the information received by virtual reality engine 1626 may be used for producing a signal (e.g., display instructions) to display module 1660. For example, if the received information indicates that the user has looked to the left, virtual reality engine 1626 may generate content for the HMD device that mirrors the user's movement in a virtual environment. Additionally, virtual reality engine 1626 may perform an action within an application in response to an action request received from user input/output module 1670 and provide feedback to the user. The provided feedback may be visual, audible, or haptic feedback. In some implementations, processor(s) 1610 may include one or more GPUs that may execute virtual reality engine 1626.

In various implementations, the above-described hardware and modules may be implemented on a single device or on multiple devices that can communicate with one another using wired or wireless connections. For example, in some implementations, some components or modules, such as GPUs, virtual reality engine 1626, and applications (e.g., tracking application), may be implemented on a console separate from the head-mounted display device. In some implementations, one console may be connected to or support more than one HMD.

In alternative configurations, different and/or additional components may be included in electronic system 1600. Similarly, functionality of one or more of the components can be distributed among the components in a manner different from the manner described above. For example, in some embodiments, electronic system 1600 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or any combination of A, B, and/or C, such as AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A device comprising:
a micro light emitting diode (micro-LED) comprising:
   a semiconductor mesa structure configured to emit light;
a spacer layer on the micro-LED; and
a micro-lens on the spacer layer and configured to extract and collimate the light emitted by the micro-LED,
wherein a thickness of the spacer layer is selected such that a focal point of the micro-lens is at a front surface of the semiconductor mesa structure facing the micro-lens.

2. The device of claim 1, wherein a lateral size of the micro-lens is equal to or greater than 1.5 times of a lateral size of the front surface of the semiconductor mesa structure.

3. The device of claim 2, wherein:
the lateral size of the micro-lens is equal to or smaller than 3 μm;
the lateral size of the front surface of the semiconductor mesa structure is equal to or smaller than 1 μm;
the thickness of the spacer layer is equal to or greater than 1 μm; and
a thickness of semiconductor materials in the semiconductor mesa structure is less than 0.6 μm.

4. The device of claim 1, wherein the thickness of the spacer layer is equal to or greater than 2 times of a thickness of semiconductor materials in the semiconductor mesa structure.

5. The device of claim 4, further comprising a transparent conductive layer between the semiconductor mesa structure and the spacer layer, wherein the transparent conductive layer comprises a thin film of indium tin oxide (ITO), Al, Ni, Au, or a combination thereof.

6. The device of claim 5, wherein the spacer layer comprises:
a first sub-layer having a thickness that is equal to or greater than about 2 times of the thickness of the semiconductor materials in the semiconductor mesa structure, wherein the first sub-layer comprises SiN; and
a second sub-layer between the transparent conductive layer and the first sub-layer and comprising $SiO_2$.

7. The device of claim 1, wherein the spacer layer comprises:
a semiconductor material, or
a dielectric material including $SiO_2$, $TiO_2$, $Al_2O_3$, SiN, HfO, AlN, or a combination thereof.

8. The device of claim 1, wherein the micro-lens and the spacer layer include a same material.

9. The device of claim 1, wherein the micro-LED further includes:
a sidewall reflector on sidewalls of the semiconductor mesa structure; and
a backside reflector on a back surface of the semiconductor mesa structure opposing the front surface of the semiconductor mesa structure.

10. The device of claim 1, wherein the semiconductor mesa structure includes sidewalls that are inwardly tilted, vertical, or outwardly tilted in a light emitting direction of the micro-LED.

11. A device comprising:
a micro light emitting diode (micro-LED) comprising:
   a semiconductor mesa structure configured to emit light, the semiconductor mesa structure characterized by sidewalls that are inwardly tilted in a light emitting direction; and
a spacer layer on the micro-LED; and
a micro-lens on the spacer layer and configured to extract and collimate the light emitted by the micro-LED,
wherein a thickness of the spacer layer is equal to or greater than 2 times of the thickness of the semiconductor materials in the semiconductor mesa structure such that a focal point of the micro-lens is at or near a front surface of the semiconductor mesa structure facing the micro-lens.

12. The device of claim 11, wherein a lateral size of the micro-lens is equal to or greater than 2 times of a lateral size of the front surface of the semiconductor mesa structure.

13. The device of claim 12, wherein:
the lateral size of the micro-lens is equal to or smaller than about 3 μm; and
the lateral size of the front surface of the semiconductor mesa structure is equal to or smaller than about 1 μm;
the thickness of the spacer layer is equal to or greater than 1 μm; and
a thickness of the semiconductor materials in the semiconductor mesa structure is less than 0.6 μm.

14. The device of claim 11, wherein the semiconductor mesa structure is inwardly tilted with a tilt angle between 10° and 25° with respect to a surface-normal direction of the front surface of the semiconductor mesa structure.

15. The device of claim 11, further comprising a transparent conductive layer between the semiconductor mesa structure and the spacer layer, wherein the transparent conductive layer comprises a thin film of indium tin oxide (ITO), Al, Ni, Au, or a combination thereof.

16. The device of claim 15, wherein the spacer layer comprises:

a first sub-layer having a thickness that is equal to or greater than about 2 times of a thickness of the semiconductor materials in the semiconductor mesa structure, wherein the first sub-layer comprises SiN; and a second sub-layer between the transparent conductive layer and the first sub-layer, wherein the second sub-layer comprises $SiO_2$.

17. The device of claim 11, wherein the spacer layer comprises:

a semiconductor material, or a dielectric material including $SiO_2$, $TiO_2$, $Al_2O_3$, SiN, HfO, AlN, or a combination thereof.

18. The device of claim 11, wherein the micro-lens and the spacer layer include a same material.

19. The device of claim 11, wherein the micro-LED further includes a sidewall reflector on the sidewalls of the semiconductor mesa structure.

20. The device of claim 11, wherein the micro-LED further includes a backside reflector on a back surface of the semiconductor mesa structure opposing the front surface of the semiconductor mesa structure.

* * * * *